United States Patent
Czubarow et al.

(10) Patent No.: US 11,527,695 B2
(45) Date of Patent: Dec. 13, 2022

(54) FIBER BASED THERMOELECTRIC DEVICE

(71) Applicant: eM-TECH, Wellesley, MA (US)

(72) Inventors: Pawel Czubarow, Wellesley, MA (US); Anthony Nicholas Czubarow, Wellesley, MA (US); Philip Abraham Premysler, Falls Church, VA (US)

(73) Assignee: eM-TECH, Framingham, MA (US)

( * ) Notice: Subject to any disclaimer, the term of this patent is extended or adjusted under 35 U.S.C. 154(b) by 73 days.

(21) Appl. No.: 16/995,582

(22) Filed: Aug. 17, 2020

(65) Prior Publication Data

US 2021/0376214 A1 Dec. 2, 2021

Related U.S. Application Data

(60) Provisional application No. 62/887,122, filed on Aug. 15, 2019.

(51) Int. Cl.
| | |
|---|---|
| *H01L 35/32* | (2006.01) |
| *B64D 41/00* | (2006.01) |
| *H01L 35/30* | (2006.01) |
| *H01L 35/20* | (2006.01) |

(52) U.S. Cl.
CPC .............. *H01L 35/32* (2013.01); *B64D 41/00* (2013.01); *H01L 35/20* (2013.01); *H01L 35/30* (2013.01)

(58) Field of Classification Search
CPC .......... H01L 35/04; H01L 35/30; H01L 35/32
See application file for complete search history.

(56) References Cited

U.S. PATENT DOCUMENTS

| | | | |
|---|---|---|---|
| 2009/0159110 A1* | 6/2009 | Kwok | H01L 35/30 136/205 |
| 2013/0000688 A1* | 1/2013 | Cho | H01L 35/32 438/54 |

\* cited by examiner

*Primary Examiner* — Lindsey A Bernier

(57) ABSTRACT

Methods of making various fibers are provided including co-axial fibers with oppositely doped cladding and core are provide; hollow core doped silicon carbide fibers are provided; and doubly clad PIN junction fibers are provided. Additionally methods are provided for forming direct PN junctions between oppositely doped fibers are provided. Various thermoelectric generators that incorporate the aforementioned fibers are provided.

8 Claims, 22 Drawing Sheets

FIG. 1
Prior Art
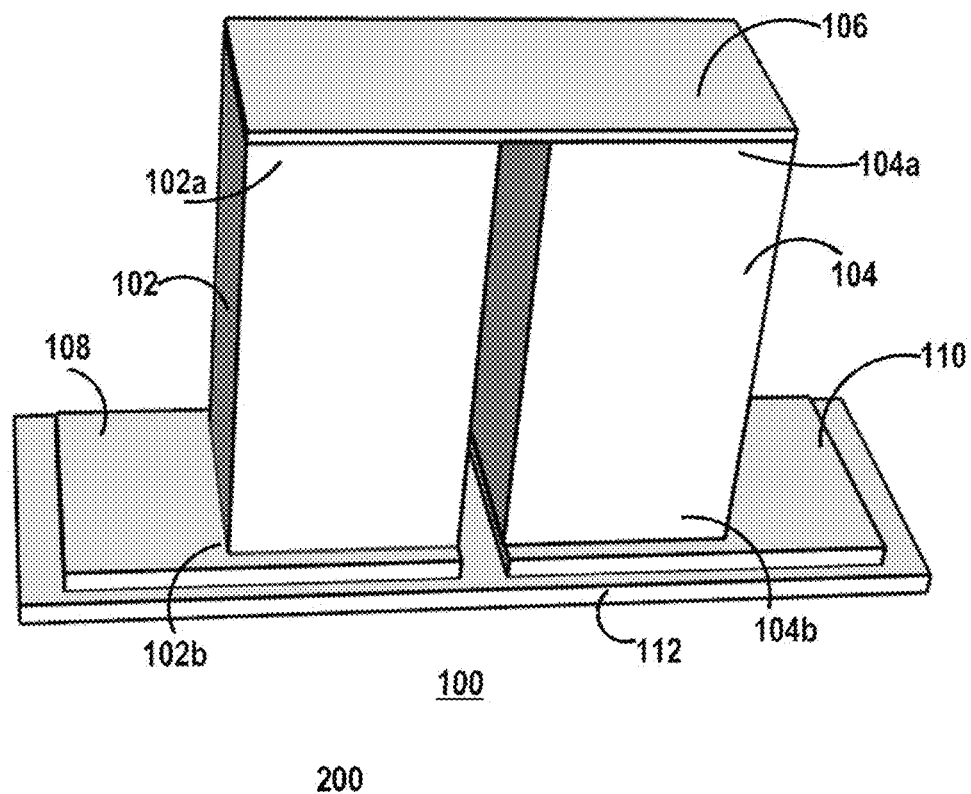
100
200
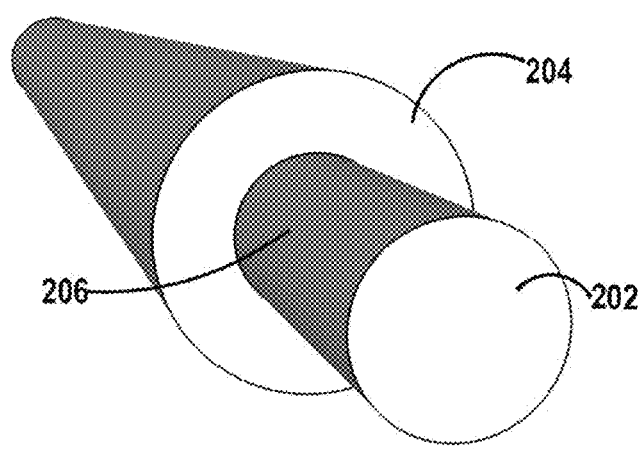
FIG. 2

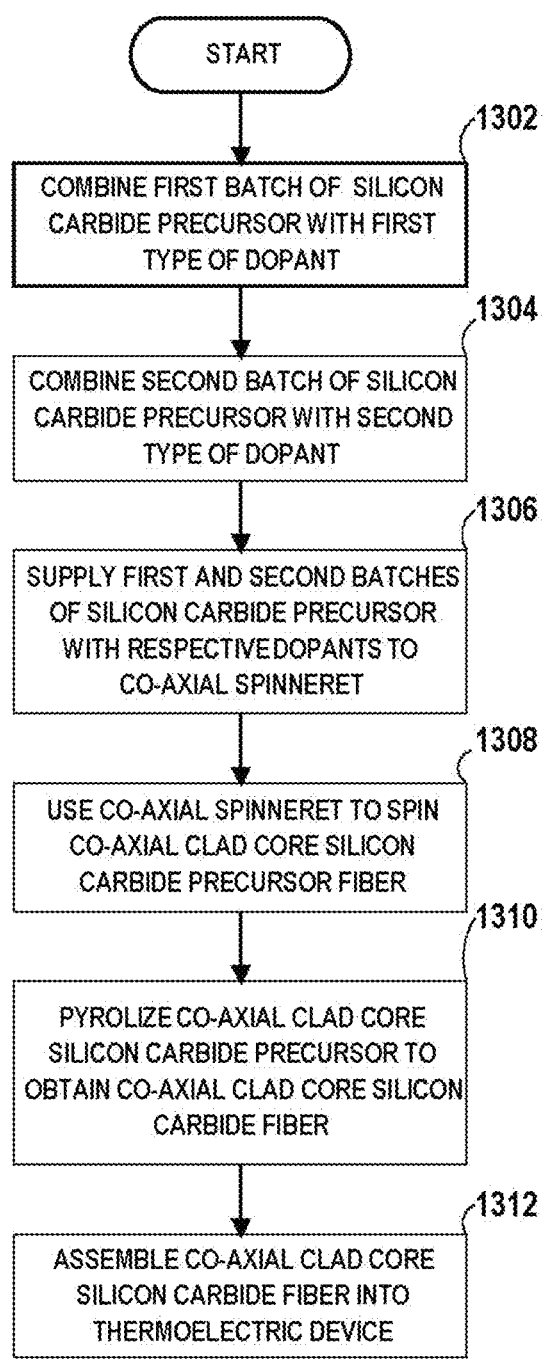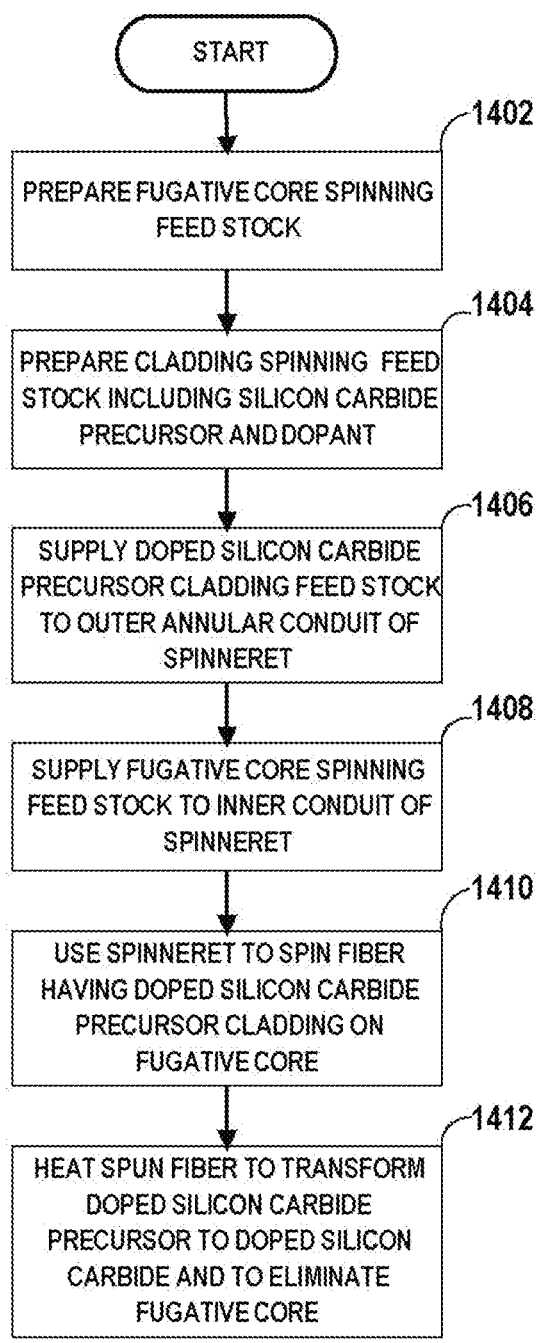

FIBER BASED THERMOELECTRIC DEVICE

STATEMENT REGARDING FEDERALLY SPONSORED RESEARCH OR DEVELOPMENT

This invention was made with government support under ONR contract #N68335-17-C-0060 awarded by the United States Department of the Navy. The government has certain rights in the invention.

CROSS REFERENCE TO RELATED APPLICATIONS

This patent application is based on provisional patent application Ser. No. 62/887,122 filed Aug. 15, 2019.

FIELD OF THE INVENTION

The present invention relates generally to thermoelectric devices.

BACKGROUND

Thermoelectric materials may be used in systems that harness electrical power for cooling and for systems that generate electrical power in response to a temperature difference between a heat source and a heat sink.

Cooling in response to an electrical current passed through a thermoelectric device is a manifestation of the Peltier effect. A basic device that manifests the Peltier effect and hence may be used for cooling includes two dissimilar materials having a junction thermally coupled to a thermal load to be cooled. The Peltier effect is described by equation 1 below:

$$\dot{Q}=(\Pi_A-\Pi_B)\cdot I \qquad \text{EQU. 1}$$

where $\dot{Q}$ is a net quantify of heat flow to the junction;
$\Pi_A$ and $\Pi_B$ are respectively the Peltier coefficient of the aforementioned two dissimilar materials; and
I is a current passed through the junction.
Selection between heating and cooling of the junction can be achieved by changing the direction of the current I through the junction;

The generation of electricity in response to the establishment of a thermal gradient across a thermoelectric device is a manifestation of the Seebeck effect. The construction of a basic device that manifests the Seebeck effect parallels the construction of a basic device that manifests the Peltier effect. The two devices do differ however in the manner of use. In the case of the Seebeck effect electrical output is obtained in response to subjecting the device to a thermal gradient whereas in the case of the Peltier effect heat is transferred in response to application of electrical power from a separate external power source. The Seebeck effect for a single conductor is described by equation 2 below.

$$J=\sigma \cdot (-\nabla V+E_{Peltier}) \qquad \text{EQU. 2}$$

where,
J is a current generated due to the Seebeck effect;
σ is an electrical conductivity of the device;
$\nabla V$ is an externally measured voltage; and $$E_{Peltier}=S\cdot \Delta T$$

Where,
S is the Seebeck coefficient; and
ΔT is the temperature gradient across the device.
By forming a junction between a P-doped semiconductor and N-doped semiconductor, both of which manifest the Seebeck effect and exposing the junction to a heat source, a continuous current can be induced to flow between proximal ends of the two semiconductors which are situated at a position removed from the heat source.

FIG. 1 shows a prior art thermoelectric generator 100. The thermoelectric generator 100 includes n-doped block 102 and a p-doped block 104. A first end 102a of the n-doped block 102, and a first end 104a of the p-doped block 104 are contact a common hot side electrical contact 106 which also serves as a heat source contact for coupling to a heat source (not shown) such as an exhaust manifold of an internal combustion engine. A second end 102b of the n-doped block 102 is coupled to first cold side electrical contact (cathode) 108 and a second end 104b of the p-doped block is coupled to a second cold side electrical contact (anode) 110. The cold side electrical contact electrical contacts 108, 110 are supported on a heat sink thermal contact 112 which in use may be connected to a heat sink (not shown). Common thermoelectric materials are brittle material and hence cannot be bent near the hot side to form a direct junction between the n-doped block 102 and the p-doped block 104. Aside from the low compliance issue, methods of forming a PN junction from blocks of p-doped and n-doped materials may not be available. Hence the hot side electrical contact 106 is provided to connect the n-doped block 102 and the p-doped block 104. Now generally speaking the efficiency of the thermoelectric effect and the amount of electrical power that can be extracted from a thermoelectric device depends on the magnitude of the temperature difference between the heat source (hot side) temperature and the heat sink (cold side) temperature. The cold side temperature is tied to the ambient temperature and differs therefrom by an amount proportional to the thermal resistance of the heat sink, so the best that can be done in respect to the cold side temperature is to approach the ambient temperature. A limiting factor in the temperature difference that may be achieved is then dependent on the maximum temperature that the hot side of the thermoelectric generator can withstand. In the prior art thermoelectric generator 100 the limiting factor may be the temperature limit of the common hot side electric contact 106 which may be made of metal. In certain applications it would be desirable to eliminate the common hot side electrical contact, so as to allow a higher hot side temperature and greater electrical output. The maximum service temperature of the P and or N thermoelectric materials may also limit the hot-cold side temperature difference that may be achieved. It would be desirable to provide a thermoelectric generator that includes thermoelectric materials that are able to sustain high temperature operation and are also unfettered by the temperature limits typically associated with hot side interconnect metallization.

SUMMARY OF THE INVENTION

One aspect of the invention is a thermoelectric generator including a heat source contact, a heat sink contact, and a plurality of co-axial fibers, each of the co-axial fibers including a core and a cladding disposed about the core, the plurality of co-axial fibers extending from the heat source contact to the heat sink contact. In such a thermoelectric generator the heat sink contact may include a first electrical contact and a second electrical contact, and the core of the co-axial fibers may extend beyond the cladding so as to present an exposed portion of the core, the cladding may be electrically coupled to the first electrical contact and the core may be electrically coupled to the second electrical contact. The heat source contact may include a hole and the plurality of co-axial fibers may have ends inserted in the hole. The plurality of co-axial fibers may have a serpentine shape that meanders back and forth between the heat source contact and the heat sink contact. In relation to the latter option the heat sink contact may further include a first electrical contact and a second electrical contact and in proceeding along a length of a particular co-axial fiber of the plurality co-axial fibers, the particular coaxial fiber includes: a first portion at which the cladding is electrically coupled to the first electrical contact; a second portion thermally coupled to the heat source contact; a third portion at which the core is exposed and is electrically coupled to the second electrical contact.

Another aspect of the invention includes a spinneret for spinning a co-axial fiber with an interrupted cladding. Such a spinneret includes: an inner conduit configured to conduct a flow of a first material for forming a core of the co-axial fiber, the inner conduit having an inner conduit inlet for receiving the first material and an inner conduit outlet for discharging the first material; an outer chamber configured to conduct a flow of a second material for forming a cladding of the co-axial fiber, the outer chamber having an outer chamber inlet for receiving the second material and an outer chamber outlet for discharging the second material, wherein the inner conduit passes through the outer chamber and the inner conduit outlet is disposed in the outer chamber outlet; and a valve mechanism configured for selectively stopping the flow of the second material. The valve mechanism may include a plunger disposed in the outer chamber around the inner conduit and a biasing element for urging the plunger into the outer chamber outlet to interrupt the flow of the second material. A solenoid may be disposed proximate the plunger and configured to counteract the biasing element and withdraw the plunger from the outer chamber outlet so as to allow the flow of the second material.

Another aspect of the invention is a thermoelectric fabric having a first set of conductive threads extending in a first direction, a second set of conductive threads extending in the first direction, and a set of co-axial thermoelectric fibers generally extending in a second direction and woven through the first set of conductive threads and the second set of conductive threads, each of the set of co-axial thermoelectric fibers including a core having a first type doping and a cladding having a second type doping, wherein the cladding contacts the first set of conductive threads, and wherein the core contacts the second set of conductive threads. A portion of the thermoelectric fibers may be looped such that the thermoelectric fabric is a looped fabric.

Another aspect of the invention includes a thermoelectric generator including: a heat source contact, a plurality of N doped hollow fibers having first ends thermally coupled to the heat source contact, a plurality of P doped hollow fibers having first ends thermally coupled to the heat source contact, a first electrical contact electrically coupled to second ends of the plurality of N doped hollow fibers, and a second electrical contact electrically coupled to the second ends of the plurality of P doped hollow fibers.

Another aspect of the invention includes a thermoelectric fiber including: an outer cladding including semiconductor having a first type of doping; an inner core including seeming conductor having a second type of doping; and an inner cladding disposed between the inner core and the outer cladding.

Another aspect of the invention includes a spinneret for forming a doubly clad core co-axial fiber, the spinneret including: an inner conduit configured to conduct a flow of a first material for forming a core of the co-axial fiber, the inner conduit having an inner conduit inlet for receiving the first material and an inner conduit outlet for discharging the first material; an intermediate chamber configured to conduct a flow of a second material for forming an inner cladding of the co-axial fiber, the intermediate chamber having an intermediate chamber inlet for receiving the second material and an intermediate chamber outlet for discharging the second material, wherein the inner conduit passes through the intermediate chamber; and the inner conduit outlet is disposed in the intermediate chamber outlet; and an outer chamber configured to conduct a flow of a third material for forming an outer cladding of the co-axial fiber, the outer chamber having an outer chamber inlet for receiving the third material and an outer chamber outlet for discharging the third material, wherein the intermediate chamber outlet is disposed in the outer chamber outlet.

Another aspect of the invention includes a thermoelectric device including: a P doped thermoelectric fiber having a first end and an N doped thermoelectric fiber having a first end wherein the first end of the P doped thermoelectric fiber is directly contacting the first end of the N doped thermoelectric fiber forming a PN junction. The thermoelectric device may include a heat source coupler thermally coupled to the PN junction. The N doped thermoelectric fiber has a second end and the P doped thermoelectric fiber has a second end. The thermoelectric device further includes a first electrical contact and a second electrical contact, the second end of the N doped thermoelectric fiber is electrically coupled to the first electrical contact and the second end of the P doped thermoelectric fiber is electrically coupled to the second electrical contact. A heat sink may be thermally coupled to the first electrical contact and the second electrical contact.

Another aspect of the invention is a method of making a thermoelectric device. The method includes: preparing a first batch of silicon carbide precursor mixed with a first type of dopant species; preparing a second batch of silicon carbide precursor mixed with a second type of dopant species; supplying the first batch of silicon carbide precursor mixed with the first type of dopant species to a first inlet of a co-axial spinneret; suppling the second batch of silicon carbide precursor mixed with the second type of dopant species to a second inlet of a co-axial spinneret; using the co-axial spinneret to spin a co-axial clad core silicon carbide precursor fiber; pyrolizing the co-axial clad core silicon carbide precursor fiber to obtain a co-axial clad core silicon carbide fiber; and assembling the co-axial clad core silicon carbide fiber precursor into the thermoelectric device.

Another aspect of the invention is a method of making a hollow thermoelectric fiber. The method includes; preparing a fugitive core spinning feed stock; preparing a cladding spinning feed stock including silicon carbide precursor and dopant; supplying the cladding feed stock to an outer annular conduit of a spinneret; supplying the fugitive core spinning feed stock to an inner conduit of the spinneret; using the spinneret to spin a fiber having a cladding including the cladding spinning feed stock and a core including the fugitive core spinning feed stock; and heating the fiber to transform the cladding feed stock to doped silicon carbide and to eliminate the core.

Another aspect of the invention is a method of making a PN junction. The method includes: obtaining a first batch of silicon carbide precursor including a first type of dopant; obtaining a second batch of silicon carbide precursor including a second type of dopant; spinning a first precursor fiber from the first batch of silicon carbide precursor including the first type of dopant; pyrolizing the first precursor fiber to obtain a first silicon carbide fiber having the first type of dopant; spinning a second precursor fiber from the second batch of silicon carbide precursor including the second type of dopant; contacting the second precursor fiber with the first silicon carbide fiber; heating the second precursor fiber that is in contact with the first silicon carbide fiber to a temperature sufficient and pyrolize the second precursor fiber to obtain second silicon carbide fiber having the second type of dopant in contact with the first silicon carbide fiber having the first type of dopant forming the PN junction.

Another aspect of the invention is another method of making a PN junction that includes: obtaining a first batch of silicon carbide precursor including an N type dopant; spinning a first precursor fiber from the first batch of silicon carbide precursor; obtaining a second batch of silicon carbide precursor including a P type dopant; spinning a second precursor fiber from the second batch of silicon carbide precursor; contacting the first precursor fiber and the second precursor fiber; subjecting the contacted first and second precursor fibers to heat and pyrolize the first and second precursor fibers to obtain an N doped silicon carbide fiber in contact with a P doped silicon carbide fiber thereby forming a PN junction.

Another aspect of the in invention is a jet engine including an outer housing, a combustion chamber and a thermoelectric generator thermally coupled to the outer housing and to the combustion chamber. The thermoelectric generator may include semiconductor fibers.

Another aspect of the invention is a rocket engine including a double walled nozzle including an inner wall, an outer wall and a thermoelectric generator located between the inner wall and the outer wall and thermally coupled to the inner wall and to the outer wall.

Another aspect of the invention is a method of forming a semiconductor junction including: obtaining silicon carbide semiconductor having a first doping type obtaining a silicon carbide precursor that includes a second doping type species, contacting the silicon carbide precursor with the silicon carbide semiconductor and pyrolyzing the silicon carbide precursor.

Another aspect of the invention is a method of forming a semiconductor junction comprising, the method including: obtaining a first silicon carbide precursor having a first doping type species, obtaining a second silicon carbide precursor having a second doping type species, contacting the first silicon carbide precursor and the second silicon carbide precursor, and pyrolyzing the first silicon carbide precursor and the second silicon carbide precursor.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 1 shows a prior thermoelectric generator;

FIG. 2 shows a co-axial clad core thermoelectric fiber according to an embodiment of the invention;

FIG. 3b shows a partially exploded view of the thermoelectric generator shown in FIG. 3a;

FIG. 4b is a second perspective view of the thermoelectric generator shown in FIG. 4a;

FIG. 5b is a cross-sectional view of the spinneret shown in FIG. 5a;

FIG. 8b is a side view of the hollow thermoelectric fiber shown in FIG. 8a;

FIG. 9b is a partially exploded view of the thermoelectric generator shown in FIG. 9a;

FIG. 12b is a partially exploded perspective view of the thermoelectric generator shown in FIG. 12a;

FIG. 13 is a flowchart of a method of making a PN co-axial clad core thermoelectric fiber according to an embodiment of the invention;

FIG. 14 is a flowchart of a method of making a hollow thermoelectric fiber according to an embodiment of the invention;

Figure 3A:
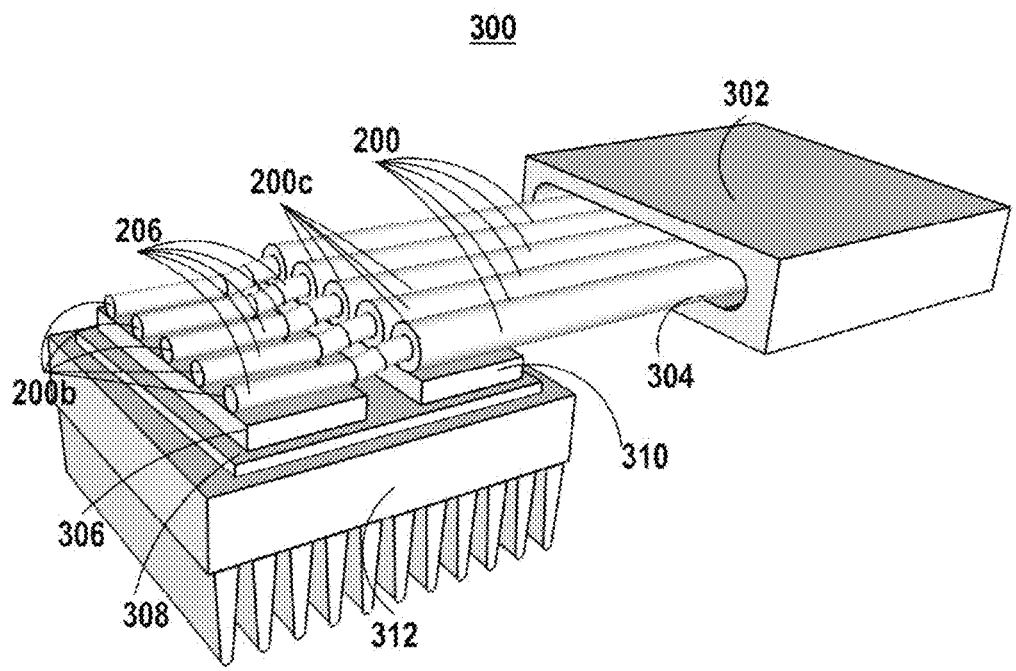
FIG. 3a shows a thermoelectric generator employing multiple co-axial clad core thermoelectric fibers of the type shown in FIG. 2.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to thermoelectric devices. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

FIG. 2 shows a co-axial clad core thermoelectric fiber 200 according to an embodiment of the invention. The thermoelectric fiber 200 includes a core 202 and a cladding 204 concentric with and surrounding the core 202. The core 202 and the cladding 204 are electrically conductive materials. The core 202 and the cladding 204 may have opposite type charge carriers. The core 202 may be an n-doped semiconductor material that predominantly has electron charge carriers whereas the cladding 204 may be a p-doped semiconductor material that predominantly has hole charge carriers. Alternatively, the core 202 may be p-doped and the cladding 204 may be n-doped. There is an exposed end portion 206 of the core 202 that is not covered by the cladding 204 in order to facilitate electric connection to the core 202.

Materials that may be used for the core 202 and/or the cladding 204 include semiconductors such as: silicon carbide, boron carbide, silicon, silicon-germanium; metals such as bismuth telluride, bismuth antimony telluride; and/or polymers such as polyaniline polysulfane, PEDOT:PSS, poly(3,4-ethylenedioxythiophene) polystyrene sulfate, semiconductor polymers Pqt12, p3ht, doped polyphenylene sulphone, poly (3,3'''-dialkylquaterthiophene) (PQT-12), or Poly(3-hexylthiophene (P3HT).

The thermoelectric fiber 200 may be made by co-axial spinning, co-axial electrospinning or co-axial extrusion. Whereas spinning typically involves using a solvent, extrusion is typically performed at a temperature above room temperature and does not include the use of a solvent.

Due to the Seebeck effect when two ends of the thermoelectric fiber are held at two different temperatures an electromotive force will be generated at the junction between the core and the cladding and an associated electric current may be extracted by connecting leads of an electrical load (not shown) to the core and the cladding in the vicinity of the end which is held at the lower temperature.

Figure 3B:
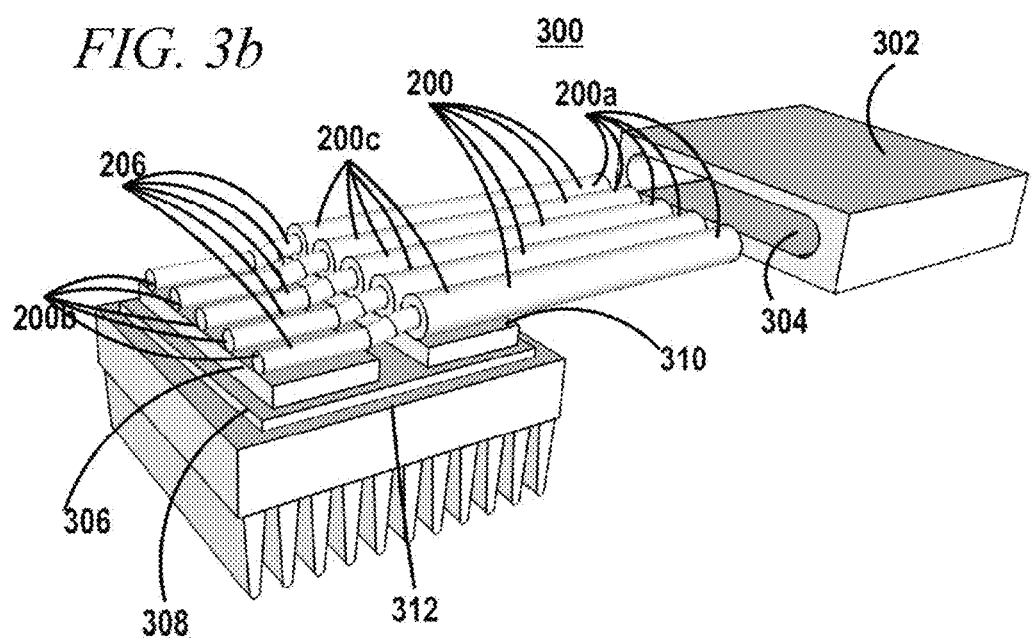

FIG. 3a shows a thermoelectric generator 300 employing multiple co-axial clad core thermoelectric fibers 200 of the type shown in FIG. 2; and FIG. 3b shows a partially exploded view of the thermoelectric generator 300 shown in FIG. 3a. The thermoelectric generator 300 includes a heat source contact 302 that includes an oblong blind recess 304 into which first ends 200a of several of the thermoelectric fibers 200 are inserted. The cross-sectional shape of the recess 304 may be other than oblong, for example circular. Rather that providing a single recess 304, multiple recesses may be provided. The aforementioned exposed end portions of the core 206 are located proximate a second ends 200b of the thermoelectric fibers 200 and are in contact with a first electrical contact 306 of a heat sink contract 308. Contact portions of the cladding 200c that are located proximate the exposed end portions of the core 206, between the exposed portions of the core 206 and the first ends 200a of the thermoelectric fibers 200 are in contact with a second electrical contact 310 of the heat sink contact 308. The heat sink contact 308 is in contact with a heat sink 312. The heat sink contact 308 may be electrically insulating and thermally conducting. The heat source contact 302 may be thermally coupled to a heat source (not shown) such as an exhaust manifold of an internal combustion engine or another high temperature heat source. The heat source contact 302 may also be placed proximate the focus of a solar concentrator. The heat sink contact 308 may be made of a refractory material so as to withstand being in contact with a high temperature heat source. Note that no metallization is required to thermally couple the thermoelectric fibers 200 to the heat source contact 302. At high temperatures thermal coupling between the heat source contact 302 and the thermoelectric fibers 200 may be dominated by radiative heat transport. Providing the recess 304 into which the thermoelectric fibers 200 are inserted fosters the aforementioned radiative heat transfer. In operation when a temperature difference is established between the heat source contact 302 and the heat sink contact 308 a thermoelectrically induced voltage will be established between core 202 and the cladding 204 of the thermoelectric fibers and consequently between the first electrical contact 306 and the second electrical contact 310. By connecting an external load (not shown) to the electrical contacts 306 310 power can be extracted from the thermoelectric generator 300.

Figure 4A:
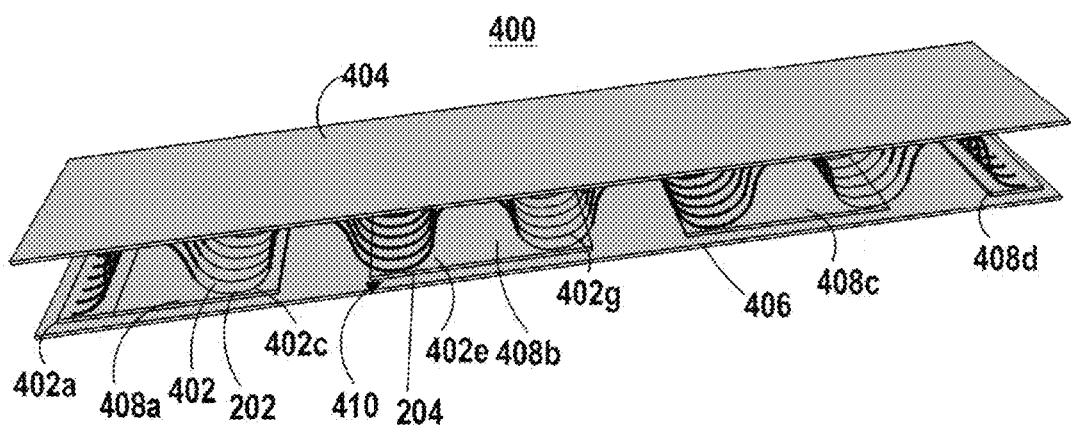
FIG. 4a is a first perspective view of a thermoelectric generator that includes co-axial clad core fibers having a meandering contour that alternately touches a heat source contact and a heat sink contact according to another embodiment of the invention.
Figure 4B:
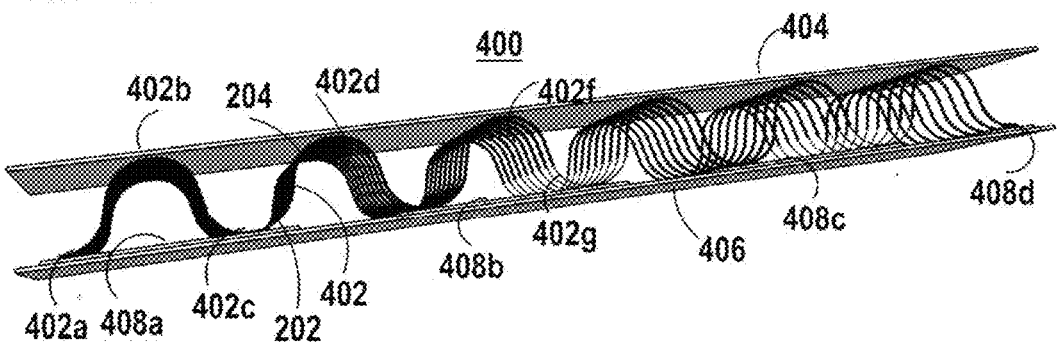

FIG. 4a is a first perspective view of a thermoelectric generator 400 that includes co-axial clad core fibers 402 having a meandering contour that alternately touches a heat source contact 404 and a heat sink contact 406 according to an embodiment of the invention and FIG. 4b is a second perspective view of the thermoelectric generator 400 shown in FIG. 4a. A first electrical contact 408a, a second electrical contact 408b, a third electrical contact 408c and a fourth electrical contact 408d are formed on a surface 410 of the heat sink contact 406 facing the heat source contact 404. The thermoelectric fibers 402 are formed into a serpentine shape that meanders back and forth between heat source contact 404 and the heat sink contact 406. Specific portions of the thermoelectric fiber 402 in the foreground of FIGS. 4a, 4b will be described it being understood that the remaining thermoelectric fibers 402 shown in FIGS. 4a, 4b have corresponding portions. As indicated in FIG. 4 the foreground thermoelectric fiber 402 includes a first portion 402a that includes the cladding 204 and is in contact with the first electrical contact 408a; a second portion 402b that includes the cladding 204 and is in contact with the heat source contact 404, a third portion 402c that does not include the cladding so that the core 202 is exposed also in contact with the first electrical contact 408a, a fourth portion 402d including the cladding in contact with the heat source contact 404, a fifth portion 402e including the cladding in contact with the second electrical contact 408b, a sixth portion 402f including the cladding in contact with the heat source contact 404, a seventh portion 402g with the core 202 exposed also in contact with the second electrical contact 408b. As illustrated in FIGS. 4a, 4b the foregoing described cyclical pattern is repeated proceeding through successive contacts with the heat source contact 404 and the third and fourth electrical contacts 408c, 408d. Moreover, the length of the thermoelectric generator 400 may be extended relative the embodiment shown in FIG. 4 with the addition of additional electrodes. By the thermoelectric effect a potential difference is established between successive electrical contacts, e.g., between the first electrical contact 408 and the second electrical contact 408b; and between the second electrical contact 408b and the third electrical contact 408c. While each potential difference may be small, the potential differences add up in series to a larger total potential difference. An electrical load (not shown) may be connect between two electrical contacts, for example between the first electrical contact 408a and the fourth electrical contact 408d in order to draw power from the thermoelectric generator 400.

According to an alternative embodiment rather than using continuous fibers that span from the first portion 402a to the seventh portion 402g, multiple separate segments are used. For example, the second portion 402b and the sixth portion 402f may be deleted to break the thermoelectric fiber 402 into multiple segments.

Figure 5A:
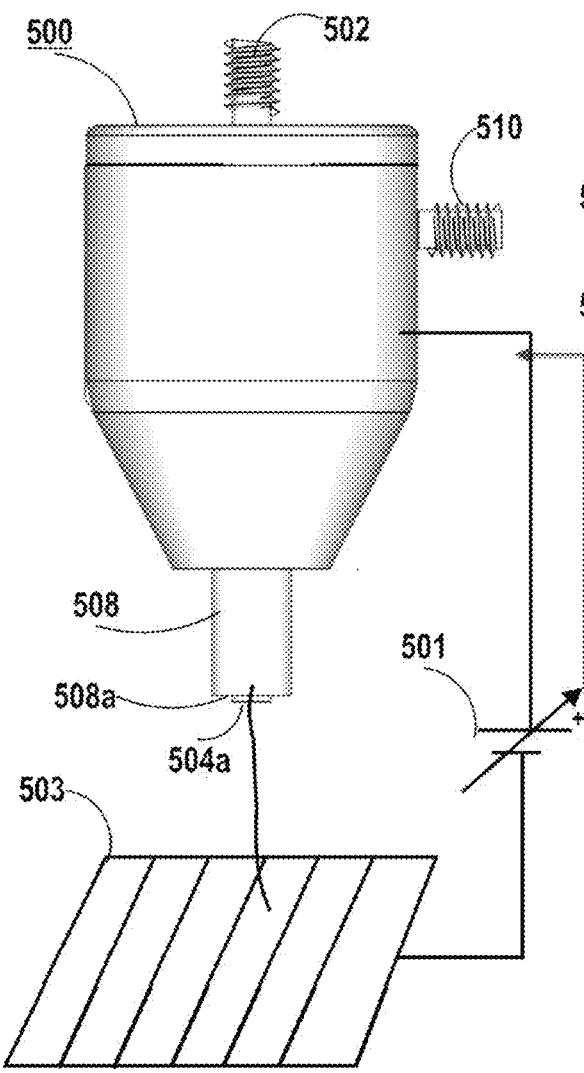
FIG. 5a is a front view of a spinneret used to spin co-axial clad core fibers along with a schematically illustrated high voltage source and a collector according to an embodiment of the invention.
Figure 5B:
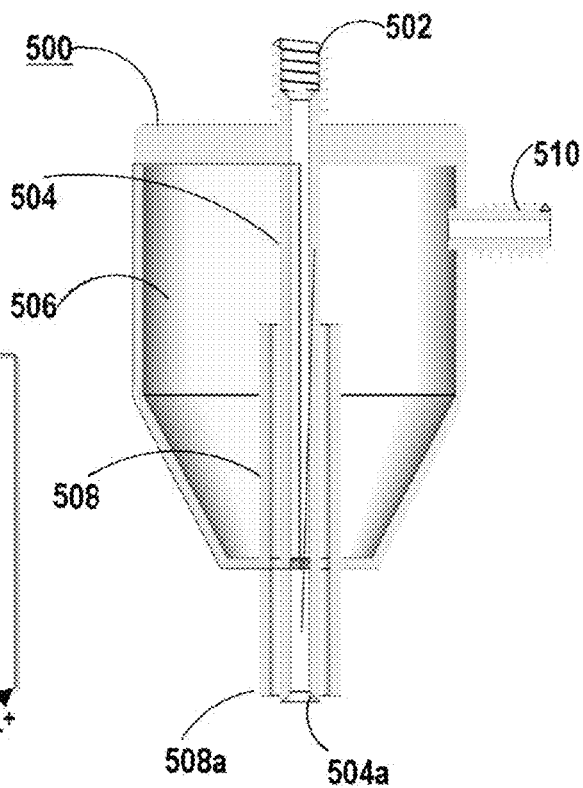

FIG. 5a is a front view of a spinneret 500 used to spin co-axial clad core fibers along with a schematically illustrated high voltage source 501 and a fiber collector 503 according to an embodiment of the invention and FIG. 5b is a cross-sectional view of the spinneret 500 shown in FIG. 5a. The spinneret 500 includes a top threaded fitting 502 that leads into an inner conduit 504. The inner conduit 504 passes through an outer chamber 506. The inner conduit 504 extends from the top threading fitting 502 to an output end 504a located below the outer chamber 506. Disposed co-axially about the inner conduit 504 is an outer conduit 508 that extends from within the outer chamber 506 to an output end 508a located around the output end 504a of the inner conduit 504. A side threaded fitting 510 leads into the outer chamber 506 and is in fluid communication with the outer conduit 508. A first electrospinning solution (not shown) for forming a core of a co-axial clad core thermoelectric fiber may be introduced into the top threaded fitting 502 and flow to the output end 504a of the inner conduit 504. A second electrospinning solution (not shown) for forming a cladding of a co-axial clad core thermoelectric fiber may be introduced into the side threaded fitting 510 and flow into the outer conduit 508 within the outer chamber 506 and out of the output end 508a of the outer conduit 508. A high voltage established between the spinneret 500 and the collector 503 by the high voltage source 501 causes the first and second electrospinning solutions to be accelerated into a reduced diameter stream which is then collected in the form of co-axial clad core fibers on the collector 503.

Figure 6A:
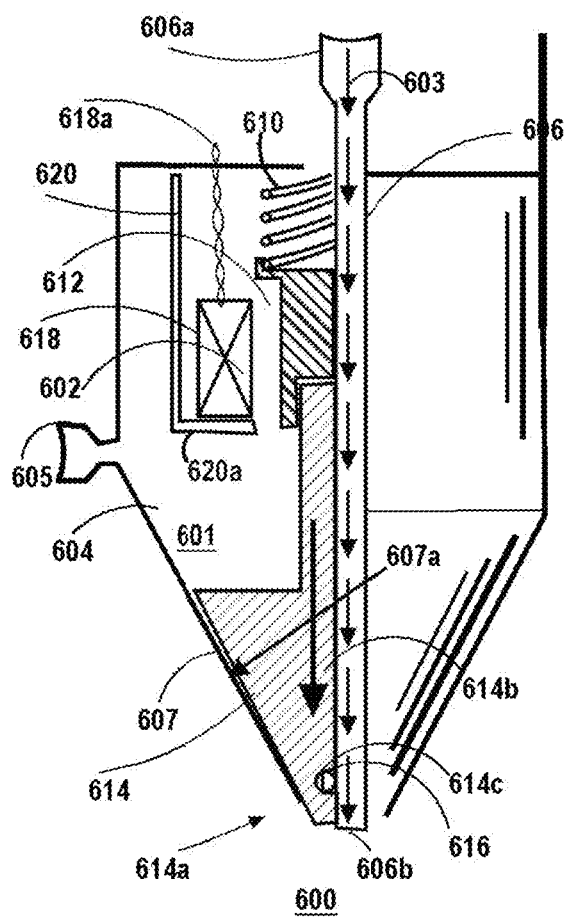
FIG. 6a shows a broken out sectional front view of a spinneret for spinning co-axial clad core fiber including an electromagnetic valve for selectively interrupting a flow of cladding spinning solution and shown with the valve in a closed state according to an embodiment of the invention.
Figure 6B:
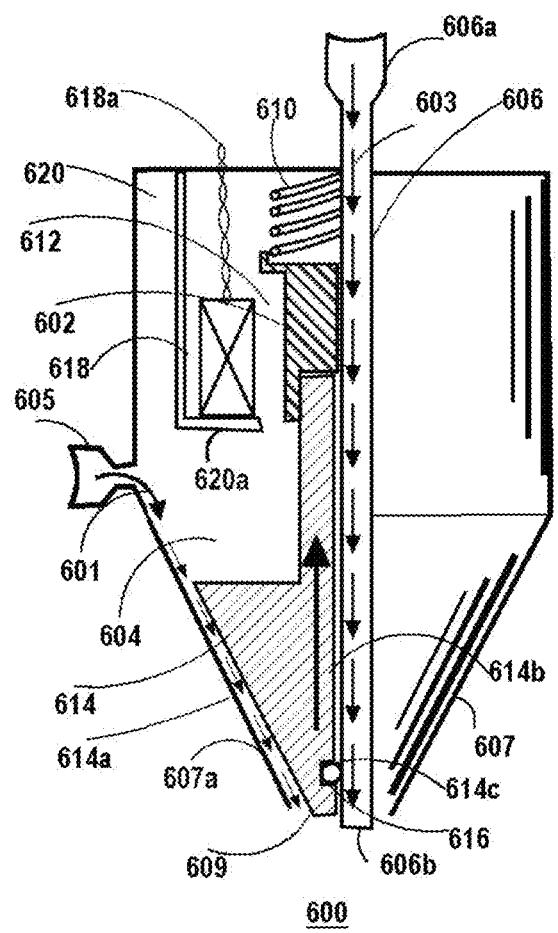
FIG. 6b is a broken out sectional view of the spinneret shown in FIG. 6a with the electromagnetic valve in an open state.

FIG. 6a shows a broken out sectional front view of a spinneret 600 for spinning co-axial clad core fiber 200 and including an electromagnetic valve 602 for selectively interrupting a flow of cladding spinning solution 601 and shown with the electromagnetic valve 602 in a closed state according to an embodiment of the invention and FIG. 6b is a broken out sectional view of the spinneret 600 shown in FIG. 6a with the electromagnetic valve 602 in an open state. The spinneret 600 includes an outer chamber 604 which serves as a valve body. An inner conduit 606 passes through the outer chamber 604. The inner conduit 606 includes an input coupling 606a for introducing a core spinning solution 603 and an outlet end 606b for expelling the core spinning solution 603 to form the core 202 of a co-axial clad core fiber 200 being spun. Flow through the inner conduit 606 is not controlled by the valve 602 but may be controlled by an external valve (not shown). The outer chamber 604 includes an input coupling 605 for introducing the cladding spinning solution 601. The outer chamber 604 includes a lower funnel portion 607 terminated by an outer chamber outlet 609. An inside conical surface of the lower funnel portion 606 serves as a valve seat 607a. A compression spring 610, a pusher 612 and a plunger 614 are disposed in the outer chamber 604. The compression spring 610 exerts a downward force on the pusher 612 which in turn exerts a downward force on the plunger 614. Alternatively a different type of biasing element may be used in lieu of the compression spring 610. The plunger 614 has a conical lower surface 614a which engages the conical valve seat 604a. Thus, the compression spring 610 urges the conical lower surface 614a into engagement with the valve seat 604a and stops a flow of the cladding spinning solution 601. The inner conduit 606 passes through a central bore 614b in the plunger 614. In inner groove 614c is formed in the central bore 614b of the plunger 614 and a sealing ring 616 is accommodated partially in the inner groove 614c and establishes a seal between the central bore 614b and the inner conduit 606 to prevent unwanted flow of cladding spinning solution 601 through the gap between the inner conduit 606 and the central bore 614b of the plunger 614.

A solenoid 618 is supported on an inner flange 620a of a solenoid support 620. Leads 618a pass from the solenoid 618 out of the outer chamber 604 to a control signal generator (not shown) for selectively actuating the solenoid 618. The plunger 614 suitably includes a ferromagnetic material (e.g., as a powder dispersed in a polymeric matrix)

or is made out of a ferromagnetic material (e.g., steel or iron). When the solenoid 618 is activated the plunger 614 is pulled upward allowing for passage of the cladding spinning solution 601 between the conical lower surface 614a and the conical valve seat 607a. The electromagnetic valve 602 can be selectively operated to cut off the flow of cladding spinning solution 601 in order to spin the exposed portions of the core 206 shown in FIG. 2 according to certain embodiments of the invention.

According to alternative embodiments of the invention the end portions of cladding material is etched away by dipping the ends of the thermoelectric fiber into an etchant. An etchant that preferentially etches the cladding material may be used to limit possible over etching into the core.

Figure 7:
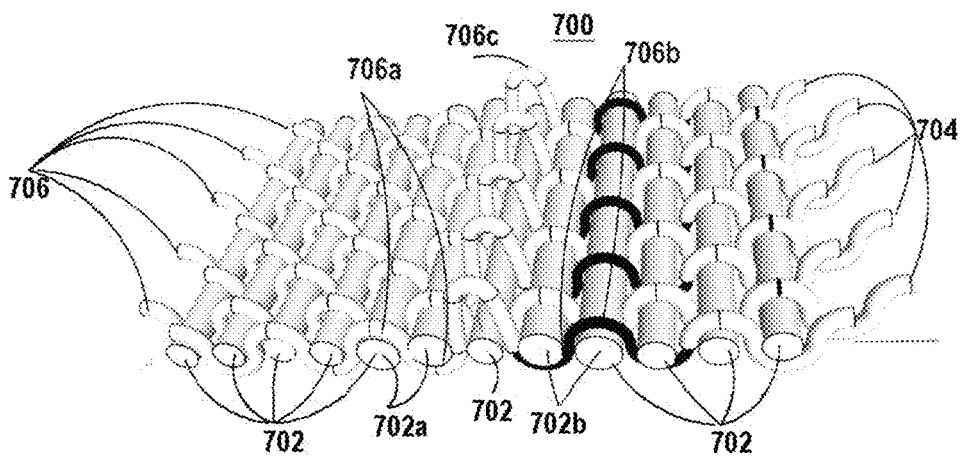
FIG. 7 shows a perspective view of a thermoelectric cloth according to an embodiment of the invention.

FIG. 7 shows a perspective view of a thermoelectric cloth 700 according to an embodiment of the invention. The thermoelectric cloth 700 includes a first set of threads 702 running in a first direction substantially perpendicular to the plane of the drawing sheet and a second set of threads 704 (a limited number of which are numbered to avoid crowding the drawing) woven through the first set of threads 702 running generally perpendicular to the first set of threads 702. The first set of threads 702 includes a first pair of conductive threads 702a and a second set of conductive threads 702b. The sets of conductive threads 702a, 702b may, for example, include metal threads or conductive polymer threads. The second set of threads 704 include co-axial clad core thermoelectric threads 706. A first portion 706a of the thermoelectric threads 706 includes the cladding 204 and is contact with the first set of conductive threads 702a. A second portion 706b of the thermoelectric threads 704 which does not include the cladding 204, has the exposed core 202 which is in contact with the second set of conductive threads 702b. A third looped portion 706c of the thermoelectric fibers 706 is located between the first portion 706a and the second portion 706b juts out of the cloth 700 to facilitate contact with a heat source (not shown). In operation when the thermoelectric cloth 700 is warmed, by action of the thermoelectric effect, an electrical potential is generated between the cladding 204 which is in contact with the first pair of conductive threads 702a and the core 202 which is in contact with the second pair of conductive threads 702b. An external load (not shown) may be connected between the first pair of conductive threads 702a and the second pair of conductive threads 702b in order to extract power from the thermoelectric cloth 700. The thermoelectric cloth 700 may be used to construct a garment such as an undershirt, or winter coat, so that human body heat can be used as the heat source to drive thermoelectric power generation. Such power, may for example be used to power portable electronics such as for example an RF, visible or infrared emergency locator beacon (not shown).

Figure 8A:
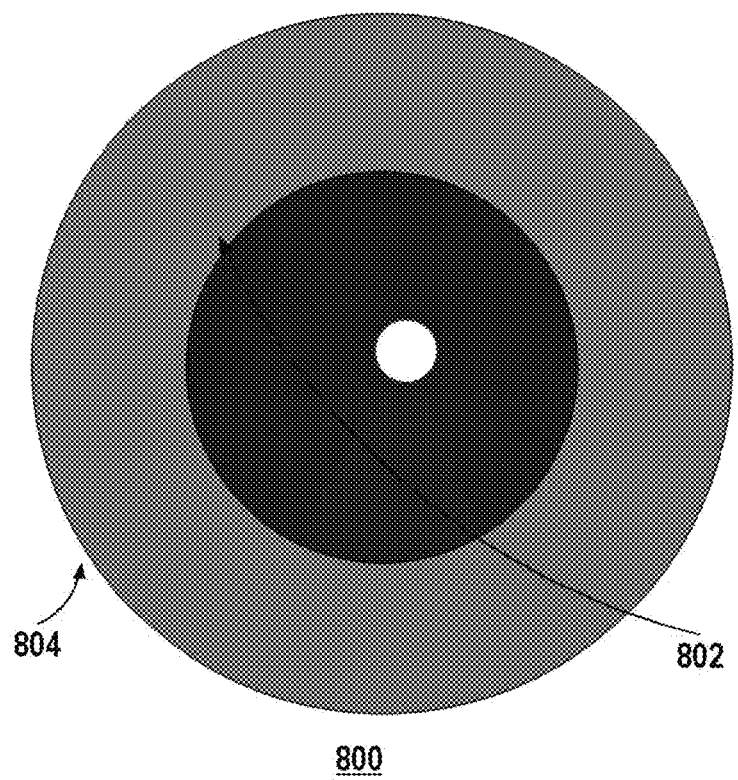
FIG. 8a is a perspective end view of a hollow thermoelectric fiber according to an embodiment of the invention.
Figure 8B:
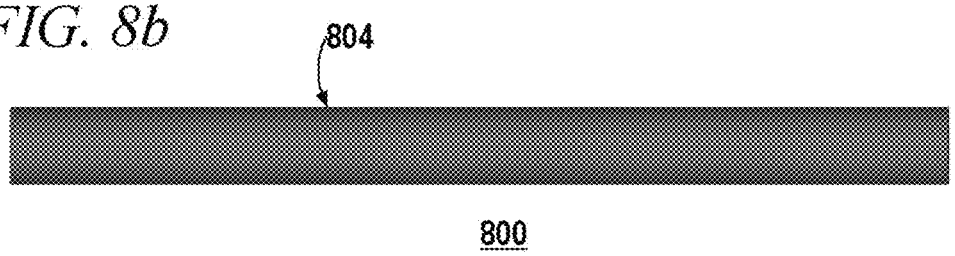
Figure 8C:
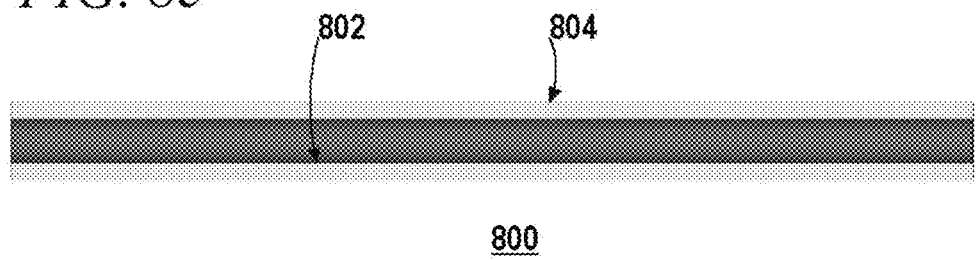
FIG. 8c is a cross-sectional side view of the thermoelectric fiber shown in FIGS. 8a, 8b.

FIG. 8a is a perspective end view of a hollow thermoelectric fiber 800 according to an embodiment of the invention; FIG. 8b is a side view of the hollow thermoelectric fiber 800 shown in FIG. 8a; and FIG. 8c is a cross-sectional side view of the thermoelectric fiber 800 shown in FIGS. 8a, 8b. The hollow thermoelectric fiber 800 includes an inside approximately cylindrical surface 802 and an outside approximately cylindrical surface 804. In certain embodiments the hollow thermoelectric 800 may be an electrospun nanoscale fiber having a wall thickness of 100 to 200 nanometers. Thermoelectric power generation efficiency is enhanced by increasing electric conductivity of thermoelectric elements and decreasing thermal conductivity. Within thermoelectric materials phonons conduct heat and increasing phonon scattering leads to decreased thermal conductivity. In nanoscale devices, phonon scattering at the surfaces is a significant contribution to phonon scattering. By making the thermoelectric fiber 800 hollow the surface area available for phonon scattering is increased leading to decreased thermal conductivity and increased thermoelectric performance. The hollow thermoelectric fiber 800 may be p-doped or n-doped. As described below a thermoelectric device may include both p-doped and n-doped thermoelectric fibers. The thermoelectric fibers may be made of a variety of materials such as mentioned above in the context of FIG. 2. In certain embodiments the hollow thermoelectric fibers may be made of doped silicon carbide that is electrospun from a doped silicon carbide precursor. A method of making the hollow thermoelectric fiber 800 is described below with reference to FIG. 14.

Figure 9A:
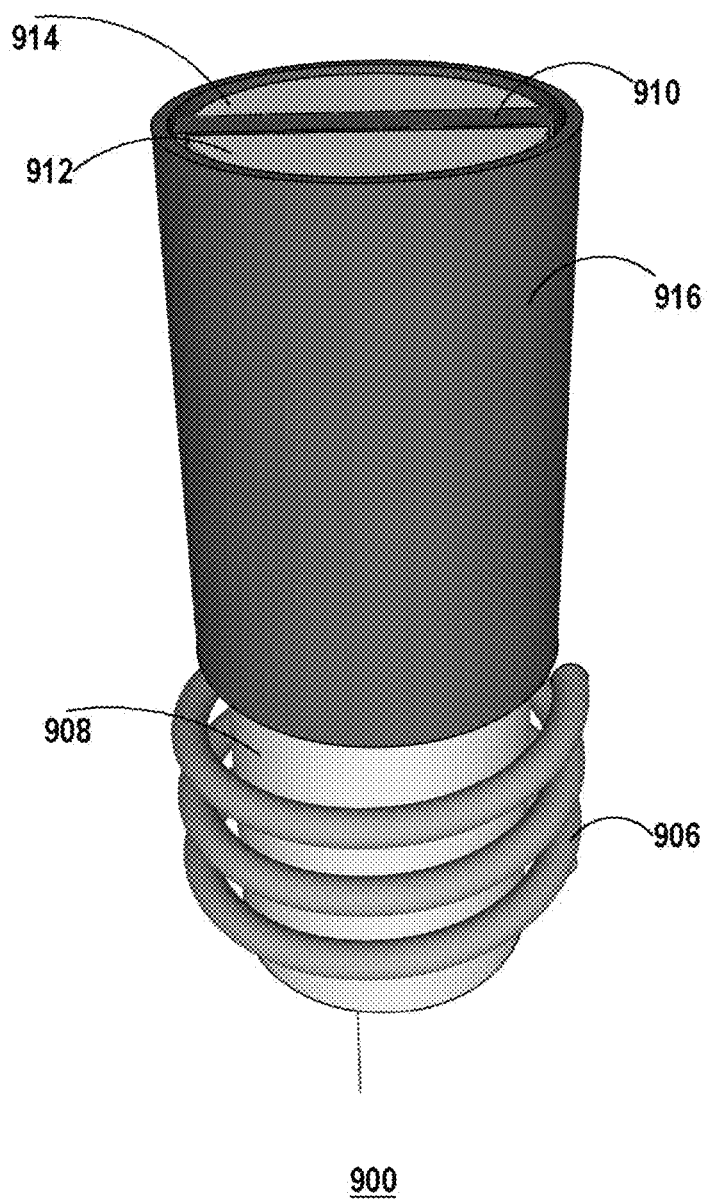
FIG. 9a is perspective view of a thermoelectric generator including hollow thermoelectric fibers of the type shown in FIGS. 8a-8c.
Figure 9B:
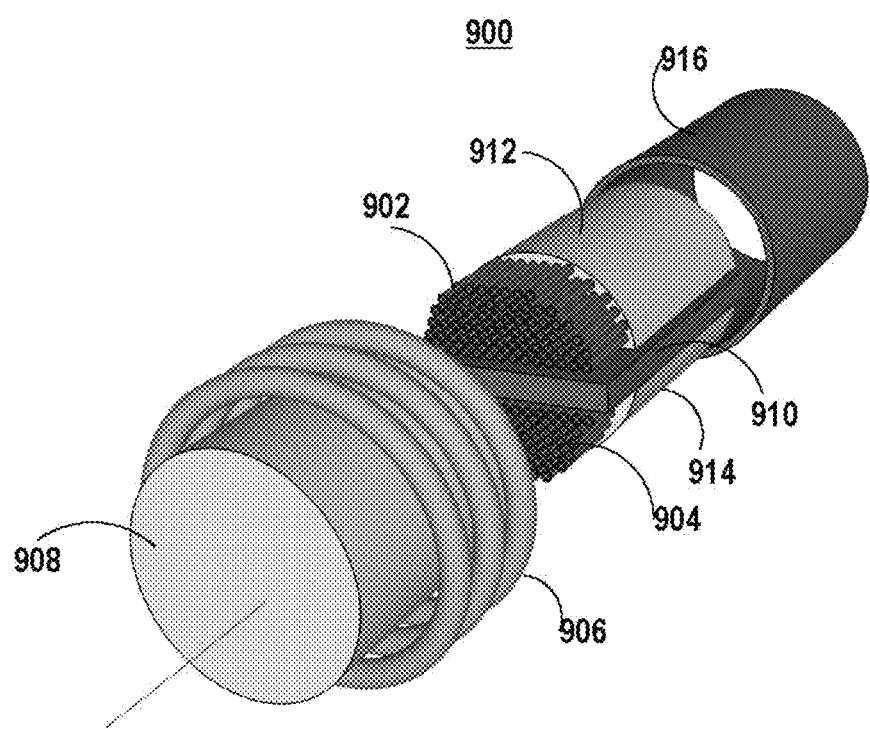

FIG. 9a is perspective view of a thermoelectric generator 900 including hollow thermoelectric fibers 902, 904 of the type shown in FIGS. 8a-8c and FIG. 9b is a partially exploded view of the thermoelectric generator 900 shown in FIG. 9a. The thermoelectric generator 900 may be used as a laboratory testbed for evaluating the performance of thermoelectric fibers 902, 904 but may also be adapted for real world applications. The thermoelectric generator 900 includes a radio frequency (RF) induction coil 906 winding around but not contacting an RF susceptor 908. An RF power source (not shown) is used to energize the RF induction coil 906. Referring particularly to FIG. 9b, an electrically insulating separator plate 910 is positioned adjacent to the susceptor 908. A first set of thermoelectric fibers 902 of a first doping type (P or N) and a first electrical contact block 912 are positioned one side of the separator plate 910, and a second set of thermoelectric fibers 904 of a second doping type (opposite to that of the first set of thermoelectric fibers 902) and a second electrical contact block 914 are positioned on an opposite side of the separator plate 910. The first set of thermoelectric fibers 902 electrically contacts the first contact block 912. The second set of thermoelectric fibers 904 electrically contacts the second electrical contact block 914. The sets of thermoelectric fibers 902, 904 are positioned proximate the RF susceptor 908 and are suitably electrically connected to each other by a conductive metal film (not visible in the perspective of FIGS. 9a, 9b) formed on a surface of the RF susceptor 908 facing the thermoelectric fibers 902, 904. An insulating sleeve 916 fits around the thermoelectric fibers 902, 904; electrical contact blocks 912, 914 and the separator plate 910. In a real world application a source of waste heat such as an engine exhaust manifold may be substituted for the RF induction coil 906 and susceptor 908. An electrical power load (not shown) may be connected to the first electrical contact block 912 and the second electrical contact block 914 in order to draw power from the thermoelectric generator 900.

Figure 10:
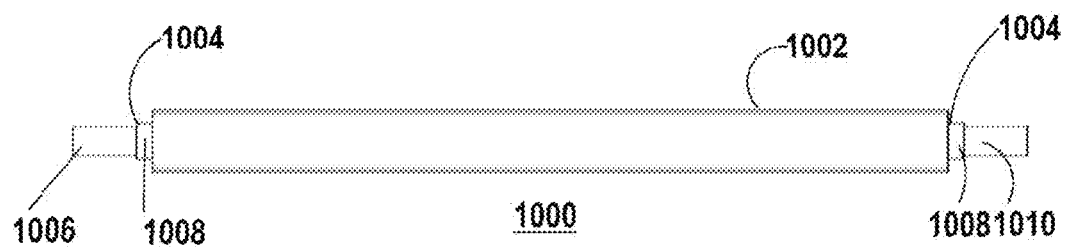
FIG. 10 is a side view of a doubly clad P-I-N co-axial fiber according to an embodiment of the invention.

FIG. 10 is a side view of a doubly clad P-I-N co-axial fiber 1000 according to an embodiment of the invention. The fiber 1000 includes a semiconducting outer cladding 1002 of a first doping type (N or P) and undoped or substantially lower level doped inner cladding 1004 and a semiconductor core 1006 of a second doping type (opposite to the doping type of the outer cladding 1002). The fiber 100 may be used in thermoelectric devices or electronic circuit applications. End portions 1008 of the inner cladding 1004 are exposed and end portions 1010 of the core 1006 are exposed.

Figure 11:
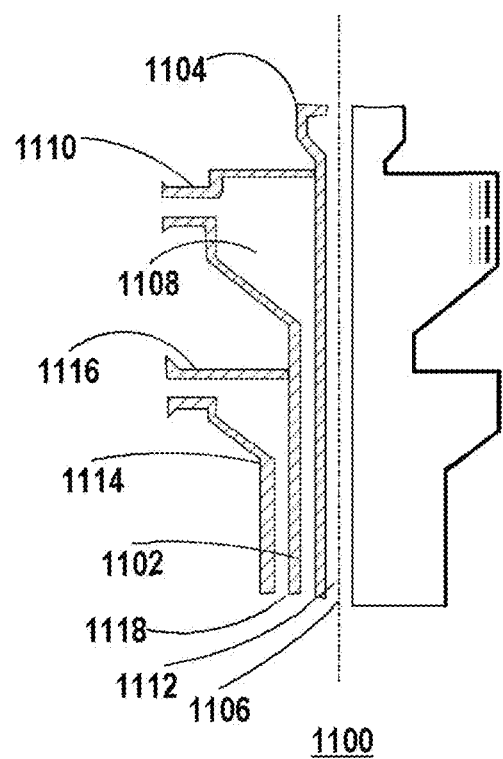
FIG. 11 is a broken out sectional elevation view of a spinneret for spinning the doubly clad co-axial fiber shown in FIG. 11.

FIG. 11 is a broken out sectional elevation view of a spinneret 1100 for spinning the doubly clad co-axial fiber 1000 shown in FIG. 11. The spinneret 1100 includes an inner conduit 1102 for supplying spinning solution for forming the core 1006. The inner conduit 1102 includes an inner conduit input coupling fitting 1104 for receiving spinning solution and an inner conduit outlet 1106 for expelling spinning solution for forming the core 1006. An intermediate chamber 1108 is disposed about the inner conduit 1102 such that inner conduit 1102 passes through the intermediate chamber 1108. The intermediate chamber 1108 includes an intermediate chamber side inlet coupling 1110 for introducing a spinning solution for forming the inner cladding 1004 and an intermediate chamber annular outlet 1112 disposed about the inner conduit outlet 1110 such the inner conduit outlet 1106 is disposed in the outlet 1112 of the intermediate chamber 1108. Spinning solution is expelled from the intermediate chamber annular outlet 1112 for forming the inner cladding 1004. The spinneret 1100 also includes an outer chamber 1114 disposed about the intermediated chamber 1108. The outer chamber 1114 includes an outer chamber side inlet 1116 for introducing spinning solution for forming the outer cladding 1002 and an annular outer chamber outlet 1118 for expelling spinning solution to form the outer cladding 1002. The annular intermediate chamber outlet 1112 is disposed in the annular outer chamber outlet 1118.

Figure 12A:
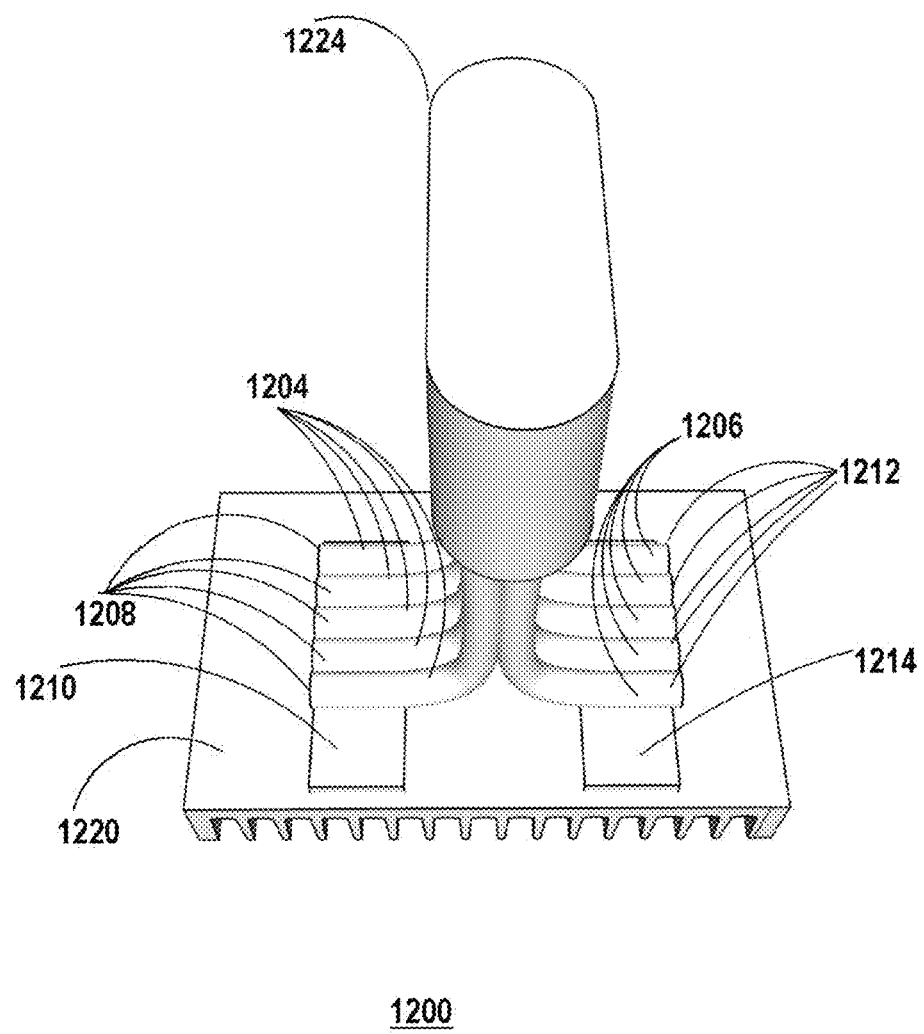
FIG. 12a is a first perspective view of a thermoelectric generator that includes a direct PN junction between thermoelectric fibers according to an embodiment of the invention.
Figure 12B:
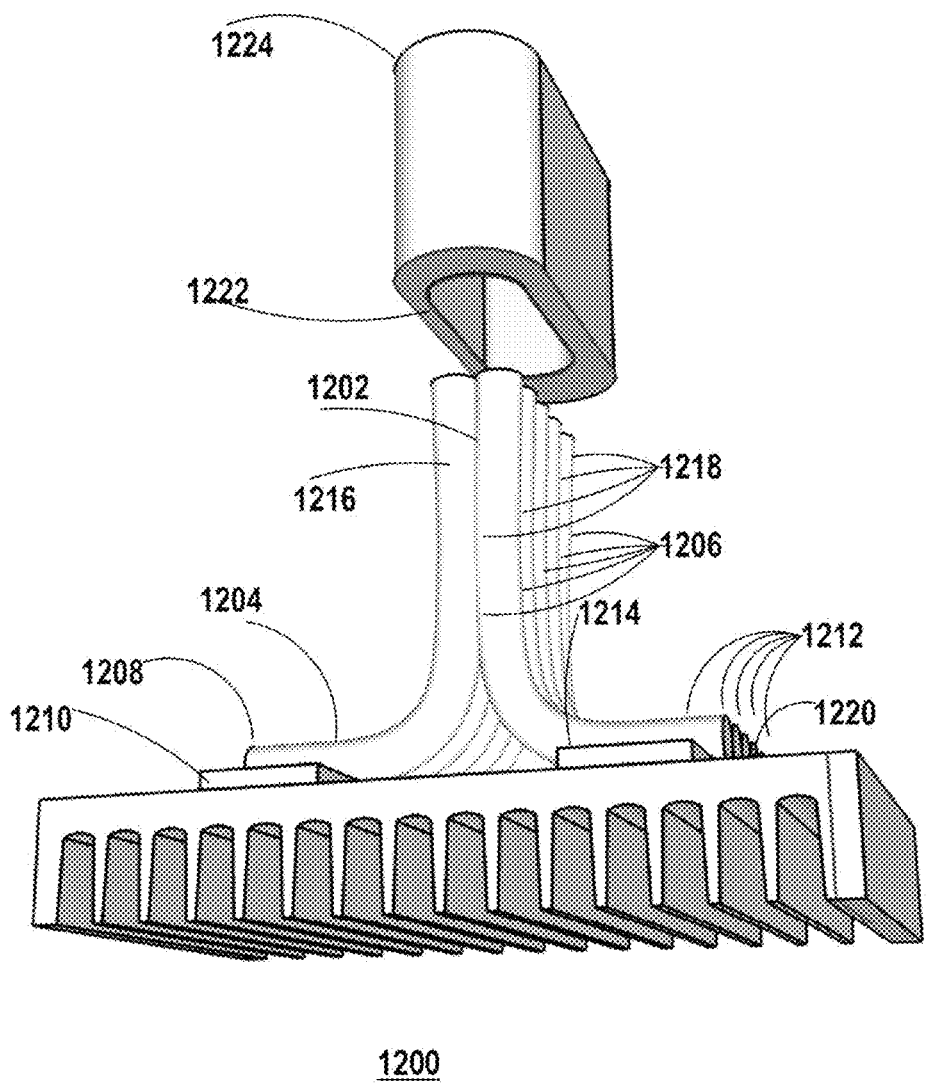

FIG. 12a is a first perspective view of a thermoelectric generator 1200 that includes a direct PN junction 1202 between thermoelectric fibers 1204, 1206 according to an embodiment of the invention, and FIG. 12b is a partially exploded perspective view of the thermoelectric generator shown in FIG. 12a. The thermoelectric generator 1200 includes a set of P-doped semiconductor fibers 1204 and a set of N-doped semiconductor fibers 1206. The semiconductor fibers 1204, 1206 may be made of the materials discussed above in reference to FIG. 2. In certain embodiments the semiconductor fibers 1204, 1206 may be made from doped silicon carbide made by pyrolizing doped silicon carbide precursors. The P-doped semiconductor fibers 1204 have first ends 1208 connected to a first electrical contact 1210 and the N-doped semiconductor fibers 1206 have first ends 1212 connected to a second electrical contact 1214. Second ends 1216 of the P-doped semiconductor fibers 1204 and second ends 1218 of the N-doped semiconductor fibers 1206 contact each other forming the direct PN junction 1202. The first electrical contact 1210 and the second electrical contact 1214 are formed on an electrically insulating, thermally conductive heat sink 1220. Alternatively the heat sink 1220 may be electrically conductive and an electrical insulation layer may be formed between the electrical contacts 1210, 1214 and the heat sink 1220. The second ends 1216, 1218 of the thermoelectric fibers 1204, 1206 including the PN junction 1202 are inserted into a recess 1222 of a heat source contact 1224. Inserting the second ends 1216, 1218 of the thermoelectric fibers 1204, 1206 into the recess 1222 enhances radiative thermal coupling between the PN junction 1202 and the heat source contact 1224. An external load may be connected between the first electrical contact 1210 and the second electric contact 1214 to draw power from the thermoelectric generator 1200. By providing the direct PN junction 1202 one can avoid using metallization to form an indirect junction between P and N thermoelectric materials as in the case of prior art designs. One benefit of not using metals on the hot side of a thermoelectric device is that metals could limit the maximum temperature, hence limit the electrical output. The heat source contact 1224 may be contacted with a source of waste heat such as an exhaust manifold of an internal combustion engine. Alternatively the heat source contact 1224 may be placed in the focus of a solar concentrator.

FIG. 13 is a flowchart of a method 1300 of making a PN co-axial clad core thermoelectric fiber according to an embodiment of the invention. In block 1302 a batch of silicon carbide precursor is combined with a first type of dopant. One type of precursor that may be used is polycarbosilane made. Another type of silicon carbide precursor that may be used is polysilane. Both are available from by Starfire® Systems, Inc of Malta, N.Y. Polycarbosilanes are also available from Nippon Carbon, Co of Japan. Another polymeric silicon carbide precursor that may be used can be synthesized by according to the teachings of U.S. Pat. No. 6,020,447. In brief '447 patent teaches a process that involves reductive coupling of chlorosilane to form polysilane in the presence of ultrasonification. The polymeric ceramic precursor may be dissolved in a solvent to produce a solution of polymeric ceramic precursor. A solvent such as toluene, tetrahydrofuran or mixtures thereof may be used. A dopant precursor may be added to the solvent. A suitable p-type dopant precursor is a phosphorous (III) organometallic compound e.g., diphenylphosphino ethylene. A suitable polymeric precursor for making n-type doped silicon carbide nanofibers can be made by dissolving SiC precursor in a suitable solvent in which is dissolved a small amount of dopant in a form of nitrogen containing species such as primary, secondary, or tertiary organic amines (e.g., melamine, ganidine), inorganic amines, organometallic silazanes. Other dopants may also be made of boron, aluminum, and carbon containing organometallic compounds.

In block 1304 a second batch of silicon carbide precursor is combined with a second type of dopant. One of the first and second types of dopants may be an N type dopant and the other of the first and second types of dopants may be a P type dopant. In other words the first and second batches of silicon carbide precursors may include opposite dopant types.

In block 1306 the first and second batches of silicon carbide precursor with respective dopants are supplied to separate input ports of a co-axial spinneret. By way of nonlimitive example, the first and second batches of silicon carbide precursor may be input to top threaded fitting 502 and side threaded fitting 510 respectively of the spinneret 500 shown in FIGS. 5a, 51b, or to the input coupling 606a and input coupling 605 respectively of the spinneret 600 shown in FIGS. 6a, 6b.

In block 1308 the spinneret is used to spin co-axial clad core silicon carbide precursor fiber. Spinning or electrospinning may be implemented in block 1308. Alternatively co-axial extruding may be performed in lieu spinning. The first batch of silicon carbide precursor may be used to form the core and the second batch of silicon carbide precursor may be used to form the cladding.

Optionally in the course of electrospinning the flow of cladding material is terminated for one or more periods of time in order to form a portion of the precursor fiber in which the cladding is absent so that the core is exposed.

In block 1310 the co-axial clad core silicon carbide precursor fiber is pyrolized to obtain a co-axial clad core silicon carbide precursor with a core and cladding having opposite doping.

Optionally, after block 1310 end portions of the cladding are etched away so as to expose the core.

In block 1312 the co-axial clad core silicon carbide fiber is assembled into a thermoelectric device. By way of nonlimitive example the co-axial clad core silicon carbide fiber may be assembled into devices such as shown in FIGS. 3a, 3b; FIGS. 4a, 4b or FIG. 7.

FIG. 14 is a flowchart of a method 1400 of making a hollow thermoelectric fiber according to an embodiment of the invention. In block 1402 a fugitive core spinning feed stock material is prepared. The fugitive core spinning feed stock is a material that disintegrates when exposed to pyrolizing conditions. The fugitive core spinning feed stock may for example include polyacrylonitrile (PAN), polystyrene (PS), polyurethane, polymethylmethacrolate (PMMA).

In block 1404 cladding spinning feed stock including a silicon carbide precursor and dopant is prepared. The silicon carbide precursor and dopant may include materials described above in reference to FIG. 13.

In block 1406 the doped silicon carbide precursor cladding feed stock is suppled to an outer annular conduit of a spinneret. By way of nonlimitive example, referring to FIGS. 5a, 5b the cladding feedstock may be supplied through the side threaded fitting 510 and outer conduit to the output end 508a which has an annular shape. According to a further nonlimitive example, referring to FIGS. 6a, 6b the cladding feed stock may be supplied through the input coupling 605 of the outer chamber 604 to the outer outlet 609 which is annular shaped.

In block 1408 the fugitive core spinning feed stock is supplied to an inner conduit of a spinneret. By way of nonlimitive example, the fugitive core spinning feed stock may be supplied to the inner conduit 504 of the spinneret 500 or to the inner conduit 606 of the spinneret 600.

In block 1410 the spinneret is used to spin fiber having a doped silicon carbide precursor cladding and a fugitive core.

In block 1412 the fiber spun in block 1410 is heated to transform the doped silicon carbide precursor cladding to doped silicon carbide and to eliminate (disintegrate) the fugitive core, thus producing a relatively high surface area, hollow doped silicon carbide fiber. Such a hollow silicon carbide fiber has the aforementioned advantages related to a relatively high thermal resistances attributable in part to phonon scattering enhanced by the increased surface area associated with the inner substantially cylindrical surface.

Figure 15:
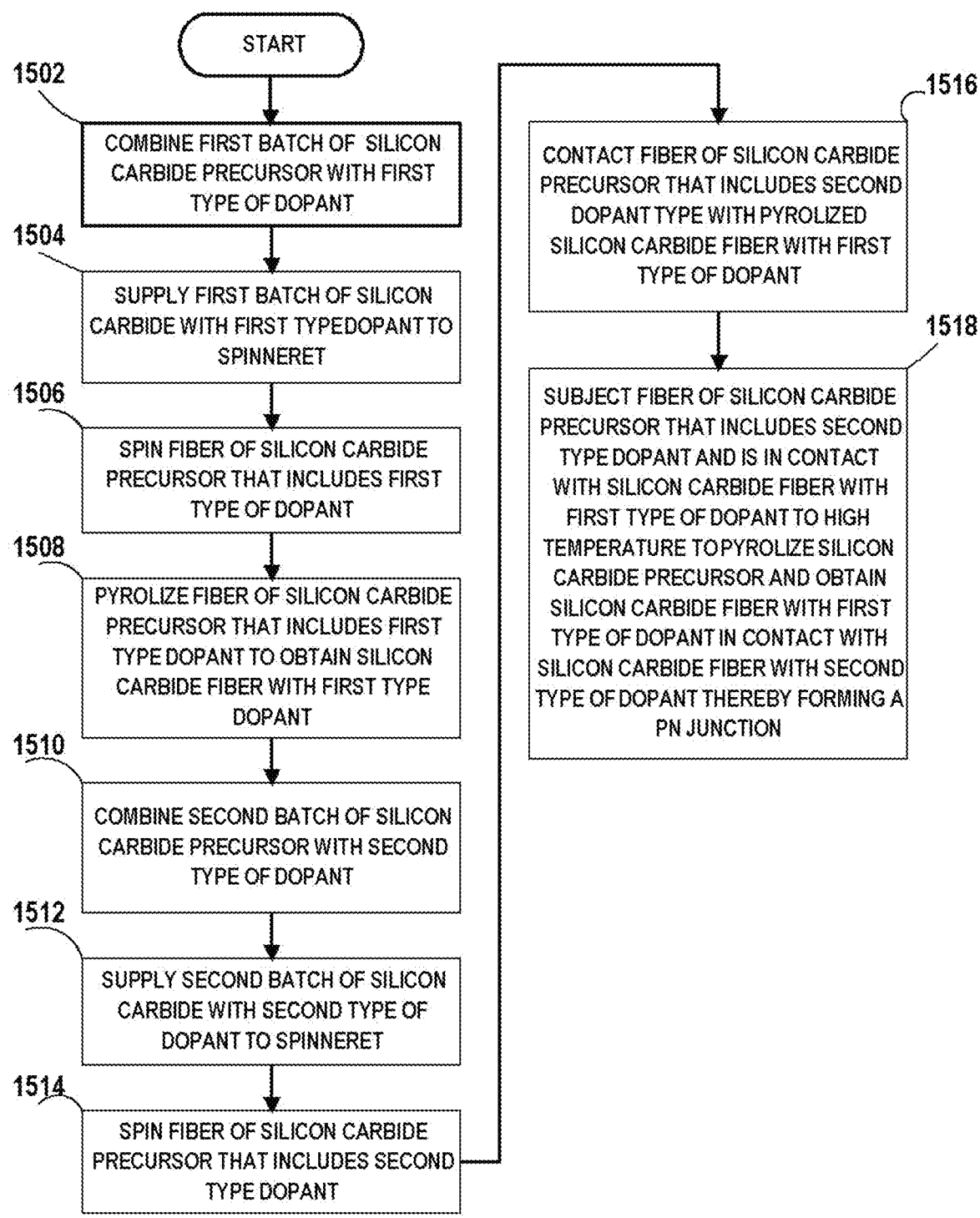
FIG. 15 is a flowchart of a first method of forming a device including a P doped fiber and an N doped fiber joined to form a PN junction according to an embodiment of the invention.

FIG. 15 is a flowchart of a first method 1500 of forming a device including a P doped fiber and an N doped fiber joined to form a PN junction according to an embodiment of the invention. In block 1502 a first batch of silicon carbide precursor is combined with a first type of dopant. The silicon carbide precursor and the dopant may include the materials described above with reference to the method 1300.

In block 1504 the first batch of silicon carbide with the first type of dopant is supplied to a spinneret. The spinneret used in blocks 1504, 1512 need not be a co-axial spinneret such as shown in FIGS. 5a, 5b, 6a, 6b, 11. Rather the spinneret may be a standard type used for spinning monolithic, homogeneous fibers. However, alternatively a co-axial spinneret may be used to spin fibers with a fugitive core in order to realize a device that includes a direct PN junction between hollow fibers.

In block 1506 the spinneret is used to spin fiber of silicon carbide precursor that includes the first type of dopant.

In block 1508 the fiber of silicon carbide precursor is used pryrolized to form obtain a silicon carbide fiber that includes the first type of dopant.

In block 1510 a second batch of silicon carbide precursor is combined with a second type of dopant. The first and second batches of silicon carbide precursor suitably include opposite dopant types. One batch may have P type dopant and the other batch may have N type dopant.

In block 1512 the second batch of silicon carbide precursor with the second type dopant is supplied to a spinneret.

In block 1514 the spinneret is used to spin fiber of silicon carbide precursor that includes the second type dopant.

In block 1516 the fiber of silicon carbide precursor that includes the second type dopant is contact with the pyrolized silicon carbide fiber that includes the first type dopant.

In block 1518 the contacted fiber of silicon carbide precursor that includes the second type dopant and is in contact with the silicon carbide fiber that includes the first type dopant is subjected to high temperature in order to pyrolize the silicon carbide precursors and obtain silicon carbide fibers with the first and second types of dopants in contact thereby forming a PN junction. Because the diffusibility of dopant species within the silicon carbide is low, it is expected that the process of first pyrolizing one fiber, then contacting the pyrolized fiber with the unpyrolized second fiber, then pyrolizing the second fiber will lead to a sharper PN junction.

The fibers made by the method 1500 may then be incorporated into a thermoelectric device such as device 1200 shown in FIGS. 12a, 12b.

Figure 16:
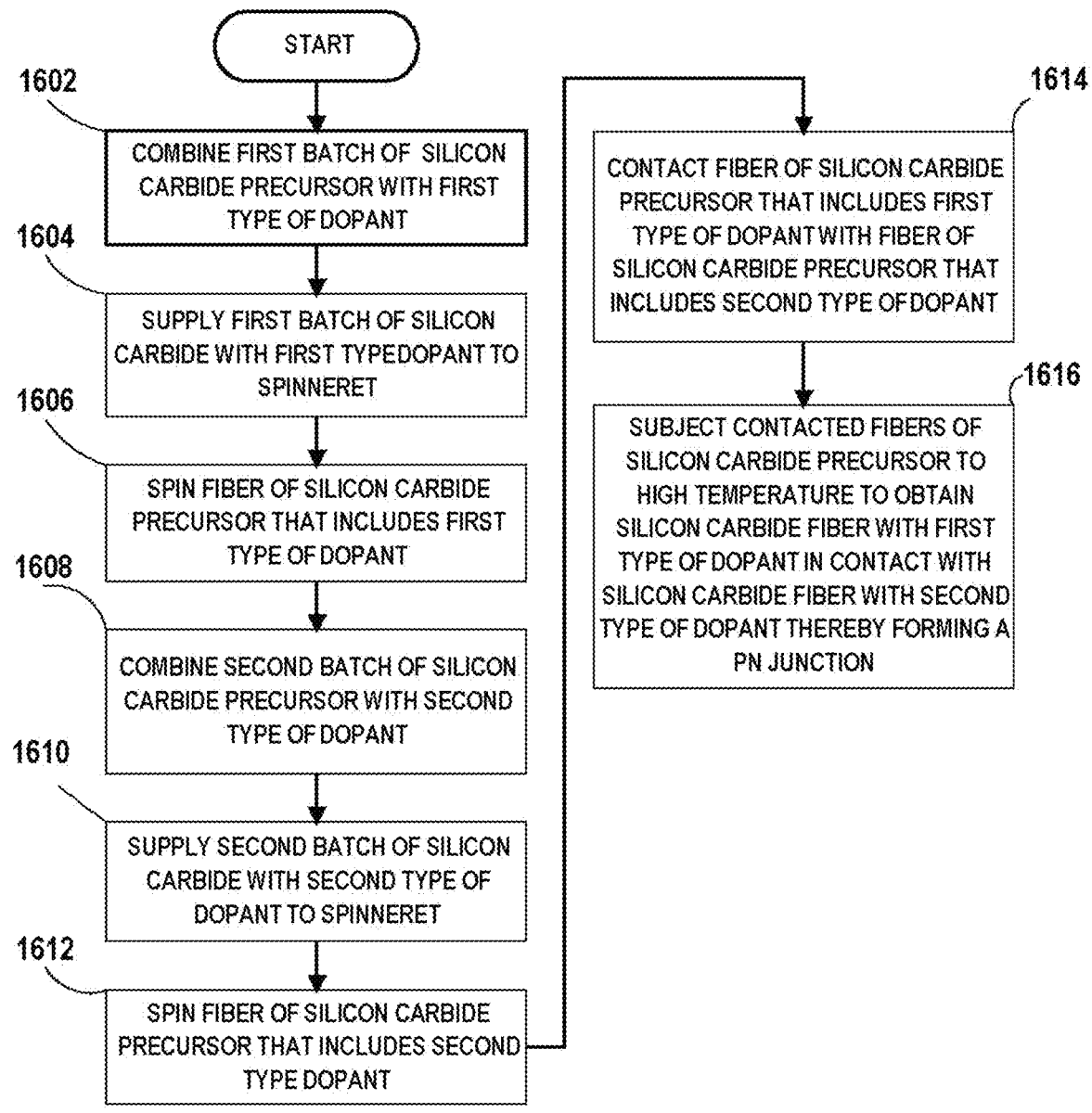
FIG. 16 is a flowchart of a second method of forming a device including a P doped fiber and an N doped fiber joined to form a PN junction according to an embodiment of the invention.

FIG. 16 is a flowchart of a second method 1600 of forming a device including a P doped fiber and an N doped fiber joined to form a PN junction according to an embodiment of the invention. In block 1602 a first batch of silicon carbide precursor is combined with a first type of dopant.

In block 1604 the first batch of silicon carbide with the first type of dopant is supplied to a spinneret.

In block 1606 the spinneret is used to spin a fiber of silicon carbide precursor including the first type of dopant.

In block 1608 a second batch of silicon carbide is combined with a second dopant type. One of the first and second dopant types may be P and the other N.

In block 1610 the second batch of silicon carbide with the second dopant type is supplied to the spinneret.

In block 1612 the silicon carbide precursor that includes the second type dopant is used to spin fiber.

In block 1614 the fiber of silicon carbide precursor that includes the first type of dopant is contacted with the fiber of silicon carbide precursor that includes the second type of dopant. The fibers may be solid however alternatively the fibers may be spun with a fugitive core resulting in hollow fibers.

In block 1616 the contacted fibers of silicon carbide precursor are subjected to high temperature to obtain silicon carbide fiber with the first type of dopant in contact with the silicon carbide fiber with the second type of dopant thereby forming a PN junction.

The contacted fibers forming the PN junction that are obtained in block 1616 may then be used in a thermoelectric device such as device 1200 shown in FIGS. 12a, 12b. Alternatively the contact fibers forming the PN junction that are obtained in block 1616 may be used in an electronic or electric power circuit, e.g., as a diode rectifier.

Figure 17:
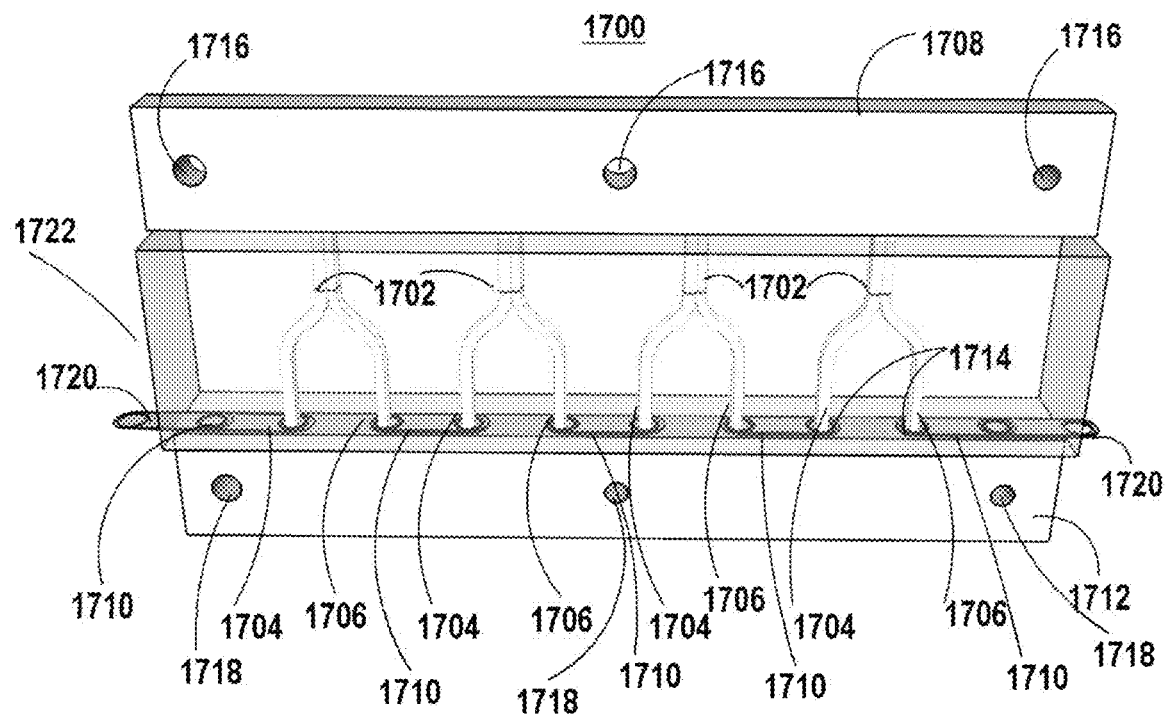
FIG. 17 is a first perspective view of a thermoelectric generator module that includes direct PN junctions between semiconductor fibers on a heat source contact side.
Figure 18:
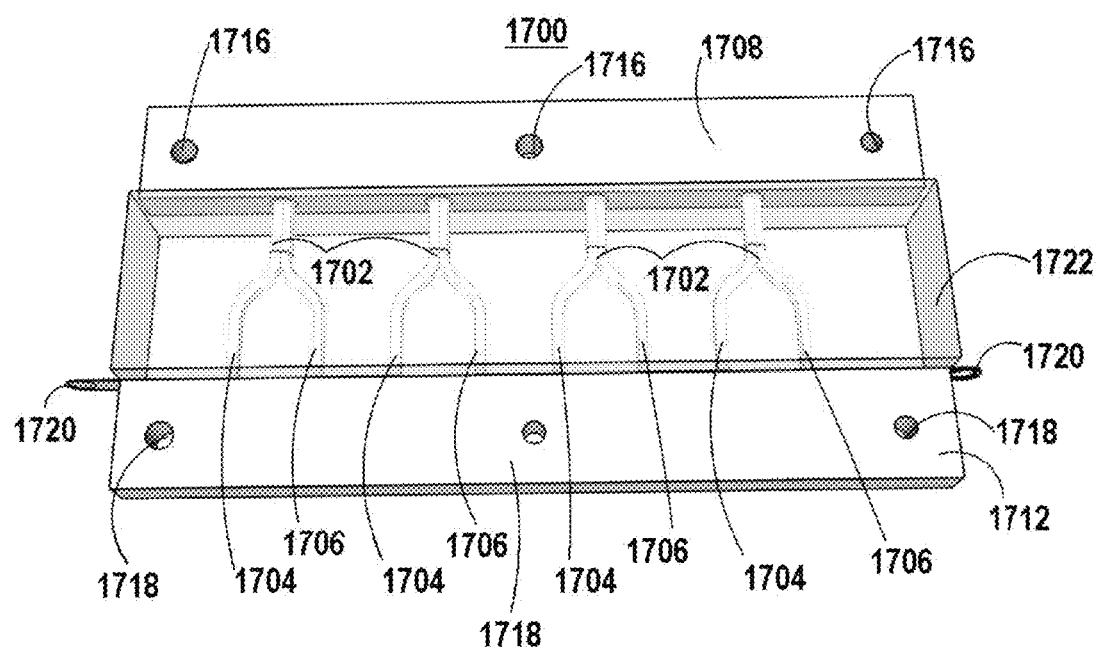
FIG. 18 is a second perspective view of the thermoelectric generator module shown in FIG. 18 showing PN junctions between semiconductor fibers inserted into black body cavity holes in the heat source contact.

FIG. 17 is a first perspective view of a thermoelectric generator module 1700 that includes direct PN junctions 1702 between semiconductor fibers 1704, 1706 on a heat source contact 1708 side and FIG. 18 is a second perspective view of the thermoelectric generator module 1700 shown in FIG. 18 showing the PN junctions 1702 between semiconductor fibers 1704, 1706 inserted into black body cavity holes 1802 in the heat source contact 1708. The semiconductors fibers 1704, 1706 include P-doped semiconductor fibers 1704 and N-doped semiconductor fibers 1706. In one embodiment that is tat is particularly suitable for use with a high temperature (e.g., above 1000 C) heat source the semiconductor fibers may be doped silicon carbide fibers. Alternatively other materials discussed hereinabove may be used. Each PN junction 1702 is a contact point between a pair of semiconductor fibers including one P doped semiconductor fiber 1704 and one N-doped semiconductor fiber 1706. A P-doped semiconductor fiber 1704 from one such pair and an N-doped semiconductor fiber 1706 from an adjacent pair are connected by electrical traces 1710 that are formed on a heat sink contact 1712. The semiconductor fibers 1704, 1706 extend from the black body cavity holes 1802 to electrical contact holes 1714 (a limited number of which are numbered to avoid crowding the drawing) in the heat sink contact 1712. The semiconductor fibers 1704, 1706 may be brazed into the electrical contact holes 1714 using a brazing material (not shown). Such brazing material may form an electrical coupling between the semiconductor fibers 1704, 1706 and the electrical traces 1710. Multiple pairs of semiconductor fibers are connected in series by the electrical traces 1710. A first set of through holes 1716 are provided in the heat source contact 1708 and a second set of through holes 1718 are provided in the heat sink contact 1712. Terminals 1720 extend from the left most and right most (in the perspective of FIGS. 17-18) electrical traces 1710 and may be used to connect the thermoelectric generator module 1700. In operation, by the agency of the thermoelectric effect, a temperature difference between the heat source contact 1708 and the heat sink contact 1712 will cause electrical power to be output through the terminals 1720. Thus, thermoelectric generator module 1700 may be used as a standalone thermoelectric generator. Alternatively as shown in FIGS. 19-20 and discussed below the module 1710 may be connected to other modules of the same type.

An aerogel 1722 is provided in the space between the heat source contact 1708 and the heat sink contact 1712. The P-doped semiconductor fibers 1704 and the N-doped semiconductor fibers 1706 extend through the aerogel 1722. The aerogel 1722 may be deposited between the heat source contact 1708 and the heat sink contact 1712 after assembly of the module 1700. The aerogel 1722 serves to increase the thermal resistance between the heat source contact 1708 and the heat sink contact 1710 which drives electrical power generation. The aerogel 1722 also serves to protect the electrical traces 1710 and any brazing from high temperatures of the heat source contact 1708.

The semiconductor fibers in any of the other thermoelectric generators described herein may also be immersed in aerogel.

Figure 19:
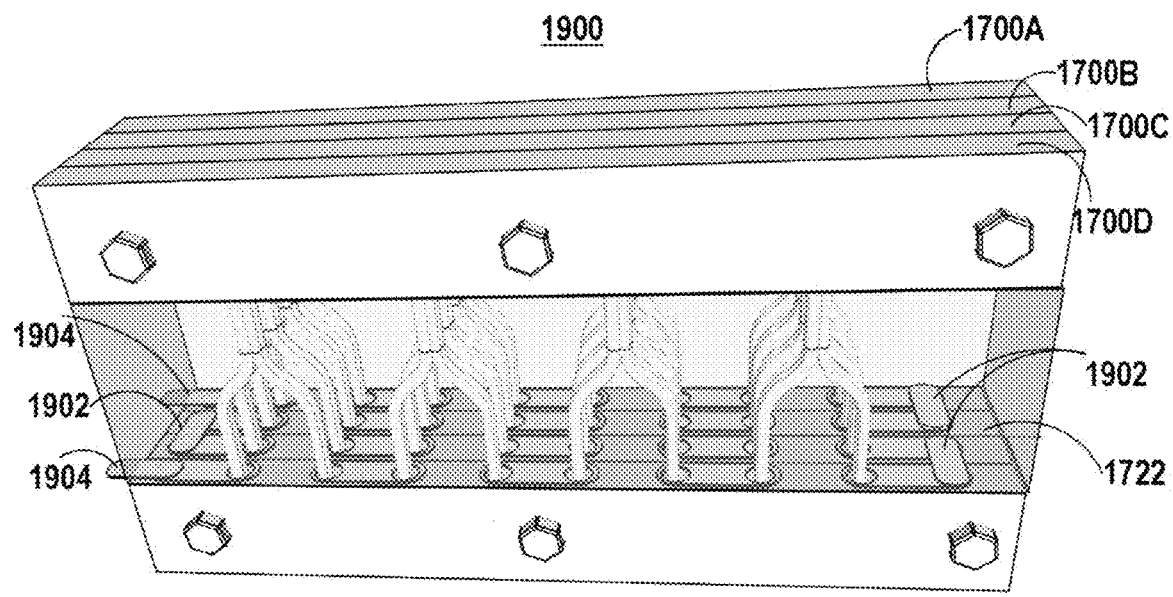
FIG. 19 is a first perspective view of a thermoelectric generator that includes multiple modules of the type shown in FIGS. 17-18.
Figure 20:
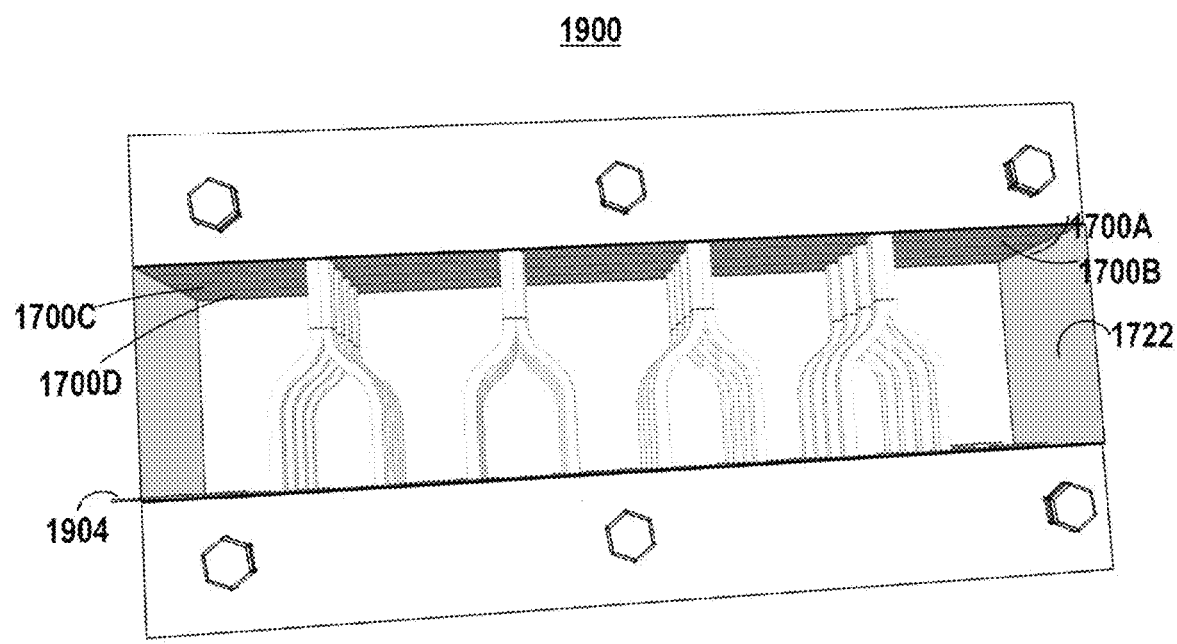
FIG. 20 is a second perspective view of a thermoelectric generator shown in FIG. 19.

FIGS. 19-20 are perspective views of a thermoelectric generator 1900 that includes four modules 1700A, 1700B, 1700C, 1700D of the type shown in FIGS. 17-18. Bolts passed through the through holes 1716 in the heat source contacts 1708 and holes 1718 of the heat sink contact 1712 are used to secure the four modules 1700A, 1700B, 1700C and 1700D together. Electrical bridges 1902 are used to connect the modules 1700A, 1700B, 1700C, 1700D electrically. Two output terminals 1904 are provided to extract electrical power from the thermoelectric generator 1900.

Figure 21:
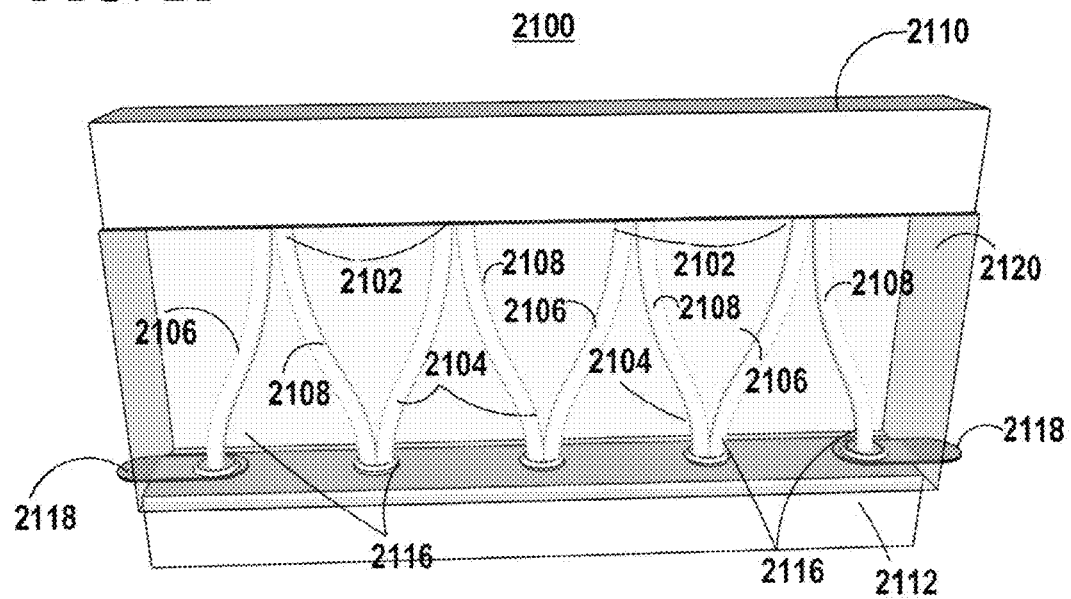
FIG. 21 is a first perspective view of a thermoelectric generator module that includes direct PN junctions between semiconductor fibers at both a heat source contact and a heat sink contact.
Figure 22:
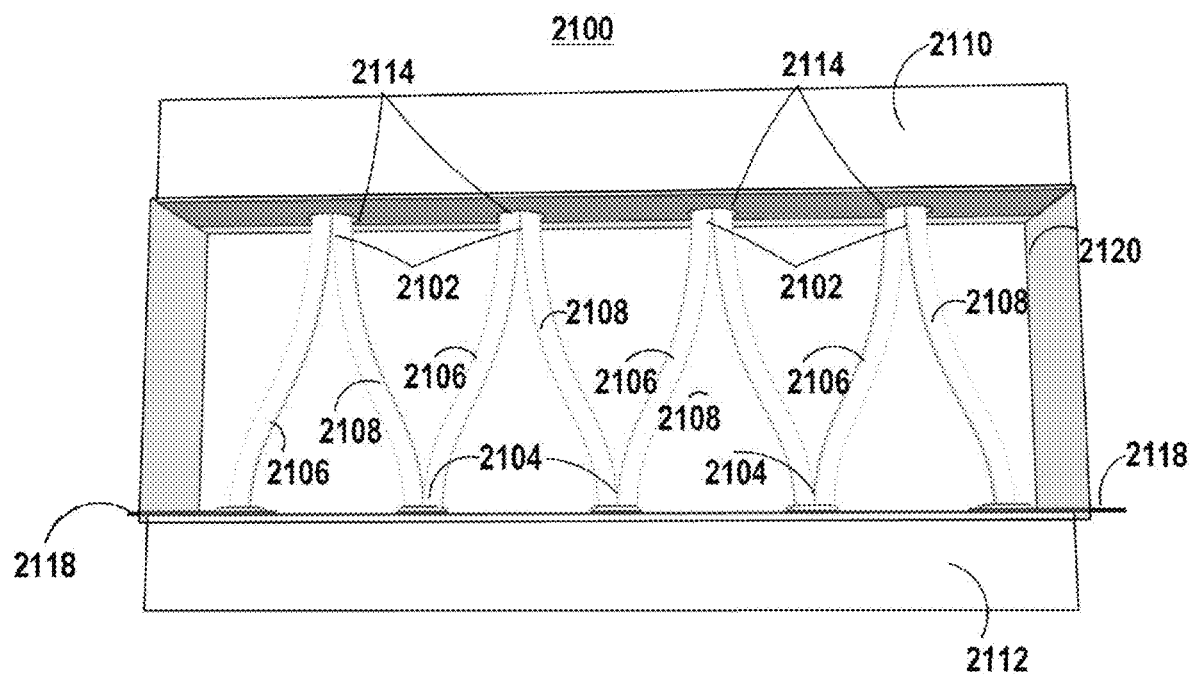
FIG. 22 is a second perspective view of the thermoelectric generator module shown in FIG. 21.

FIGS. 21-22 are perspective views of a thermoelectric generator module 2100 that includes direct PN junctions 2102, 2104 between semiconductor fibers 2106, 2108 at both a heat source contact 2110 and a heat sink contact 2112. The thermoelectric generator module 2100 includes P-doped semiconductor fibers 2106 and N-doped semiconductor fibers 2108 which are connected in series. The semiconductor fibers 2106, 2108 alternate along the series, such that except for at the ends of the series, each P-doped semiconductor fiber 2106 is preceded and followed by one of the N-doped semiconductor fibers 2108. A first group of PN junctions 2102 between the fibers are located at the heat source contact 2110 and a second group of of PN junctions 2104 are located at the heat sink contact 2112. PN junctions from the first group 2102 and second group 2104 alternate along the series of fibers 2106, 2108. The first group of PN junctions 2102 are thermally coupled to the heat source contact 2110 by being inserted into a series of holes 2114 in the heat source contact 2110. The heat source contact 2110 may be operated at a sufficiently high temperature (e.g., above 1000 C) such that radiative coupling is effective in transferring heat from the heat source contact 2110 to the first set of PN junctions. The second group of PN junctions 2104 may be brazed using a brazing material 2116 into a set of holes (filled with brazing material 2116 and hence not visible) in the heat sink contact 2112). Ends of the series fibers 2106, 2108 are connected to electrical output terminals 2118 located at the heat sink contact 2112. An aerogel material 2120 is disposed between the heat source contact 2110 and the heat sink contact 2112. The series of fibers 2106, 2108 passes through the aerogel material 2120. The aerogel 2120 functions as discussed above in reference to FIGS. 17-18.

Figure 23:
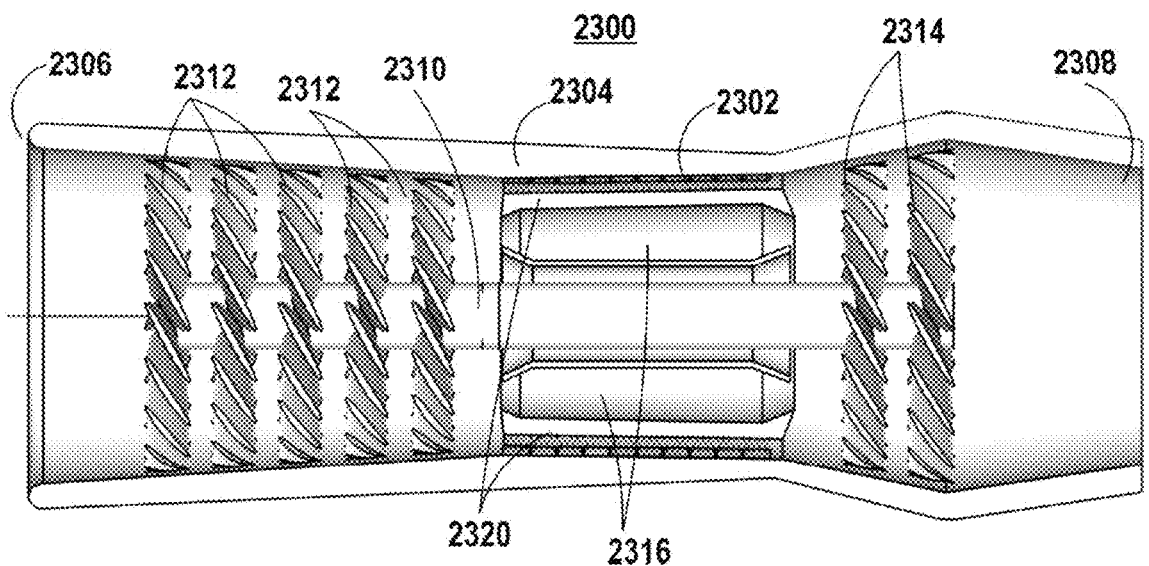
FIG. 23 is a cross-sectional view of a jet engine that includes a semiconductor fiber based thermoelectric generator according to an embodiment of the invention.

FIG. 23 is a cross-sectional view of a jet engine 2300 that includes a semiconductor fiber based thermoelectric generator 2302 according to an embodiment of the invention. Referring to FIG. 23, the jet engine has an outer housing 2304, which has an intake end 2306 at the left of the drawing sheet and a thrust exhaust end 2308 at the right of the drawing sheet. An axial shaft 2310 is centered within the housing 2304. The axial shaft 2310 may include subcomponents not distinctly shown. Nearer to the intake end 2306 the axial shaft carries a set of compressor fans 2312 and nearer to the thrust exhaust end (nozzle) 2308 the axial shaft caries a set of turbine fans 2314. A combustion chamber 2316 defined by an inner circumferential combustion chamber wall 2318 and an outer circumferential combustion chamber wall 2320 is disposed about the axial shaft 2310 between the compressor fans 2312 and the turbine fans 2314. A fuel system (not shown) supplies a combustible fuel to the combustion chamber 2316. In operation, combustion in the combustion chamber drives the turbine fans 2314 which in-turn drive the compressor fans 2312. The semiconductor fiber based thermoelectric generator 2302 is located in an axially extended circumferential space between the outer circumferential combustion chamber wall 2320 and the outer housing 2304 of the jet engine 2300. In operation combustion in the combustion chamber sets up a thermal gradient between the outer circumferential combustion chamber wall 2320 and the outer housing 2304 of the jet engine. The thermoelectric generator 2302 used in the jet engine 2300 may be of any of the types described above and reference is made to the descriptions hereinabove for the particular details thereof. By way of nonlimiting example in the case that the thermoelectric generator 2302 of the jet engine 2300 includes the thermoelectric generator module 2100 shown in FIGS. 21-22 the heat source contact 2110 will be thermally coupled to the outer circumferential combustion chamber wall 2302 and the heat sink contact 2112 will be thermally coupled to the outer housing 2304.

Figure 24:
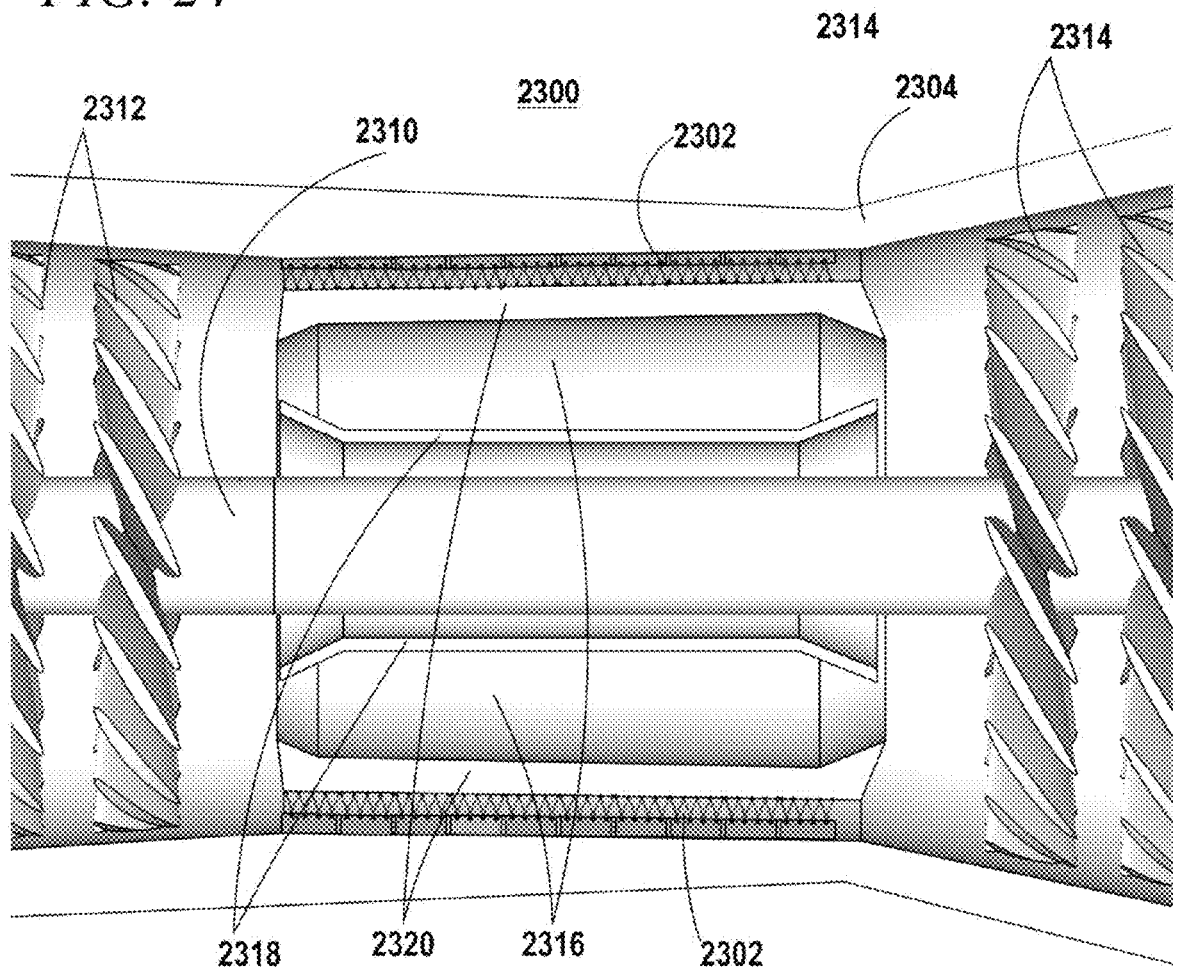
FIG. 24 is an enlarged broken out portion of the jet engine shown in FIG. 23 including the semiconductor fiber based thermoelectric generator position around a combustion chamber of the jet engine.
Figure 25:
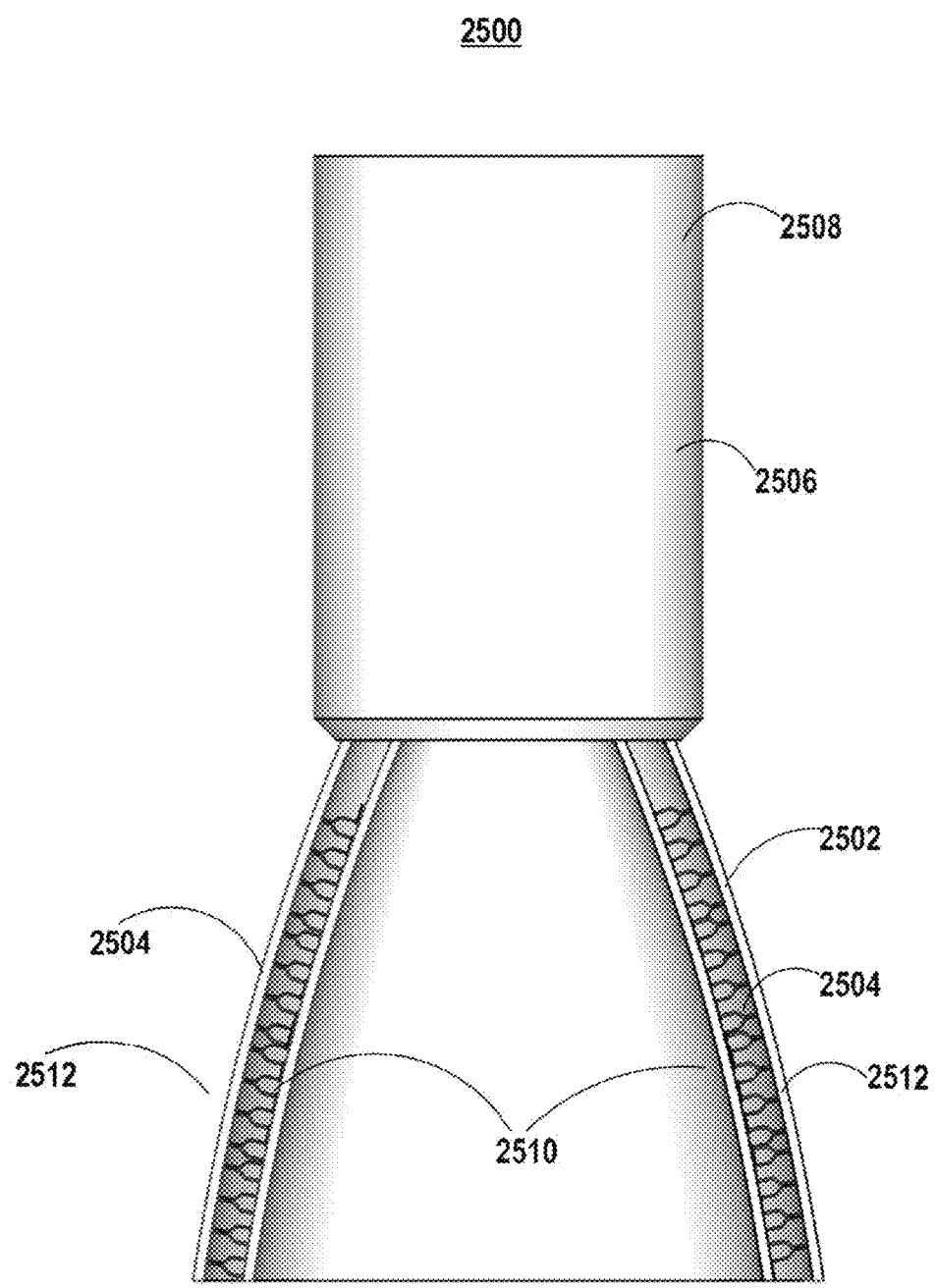
FIG. 25 shows a partially sectioned portion of a rocket engine including a double walled nozzle accommodating a semiconductor fiber based thermoelectric generator according to an embodiment of the invention.

FIG. 24 is an enlarged broken out portion of the jet engine 2300 shown in FIG. 23 including the nanofiber based thermoelectric generator position around a combustion chamber of the jet engine; and FIG. 25 shows a partially sectioned portion of a rocket engine 2500 including a double walled nozzle 2502 accommodating a semiconductor fiber based thermoelectric generator 2504 according to an embodiment of the invention. Referring to FIG. 25, a lower portion 2506 of a rocket tube 2508 is attached to the double walled nozzle 2502. The double walled nozzle 2502 includes an inner wall 2510 and an outer wall 2512. The semiconductor fiber based thermoelectric generator 2504 is disposed between the inner wall 2510 and the outer wall 2512. In operation heated combustion products exiting the rocket engine through the nozzle 2502 (flowing within the inner wall 2510) and cooler ambient air streaming past the outside of the nozzle (in contact with the outer wall 2512) will establish a thermal gradient between the inner wall 2510 and the outer wall 2512 through the thermoelectric generator 2504, thereby driving electrical power by the thermoelectric generator. Thus, in operation the inner wall 2510 will have a temperature greater than the outer wall 2512. The thermoelectric generator 2504 is thermally coupled to the inner wall 2510 and the outer wall 2512. The thermoelectric generator 2504 may be of any of the types described above and reference is made to the descriptions hereinabove for the particular details thereof.

The jet engine 2300 shown in FIGS. 23-24 and the rocket engine 2500 are two forms of thrust propulsion engines. Thrust propulsion engines generally include a thrust exhaust (e.g., double walled nozzle 2502, thrust exhaust end [nozzle] 2308) that operates at high temperature, and according to a broader class of embodiments a thermoelectric generator is integrated in the thrust exhaust of a thrust propulsion engine. Referring again to FIGS. 23-24 according to an alternative embodiment the thrust exhaust end (nozzle) 2308 is made in a double wall configuration analogous to the double walled nozzle 2502 and a thermoelectric generator is integrated between the inner and outer wall.

By way of nonlimiting example in the case that the thermoelectric generator 2502 of the rocket engine 2500 includes the thermoelectric generator module 2100 shown in FIGS. 21-22 the heat source contact 2110 will be thermally coupled to the inner wall 2510 of the nozzle 2502 and the heat sink contact 2112 will be thermally coupled to the outer wall 2512 of the nozzle 2502.

Figure 26:
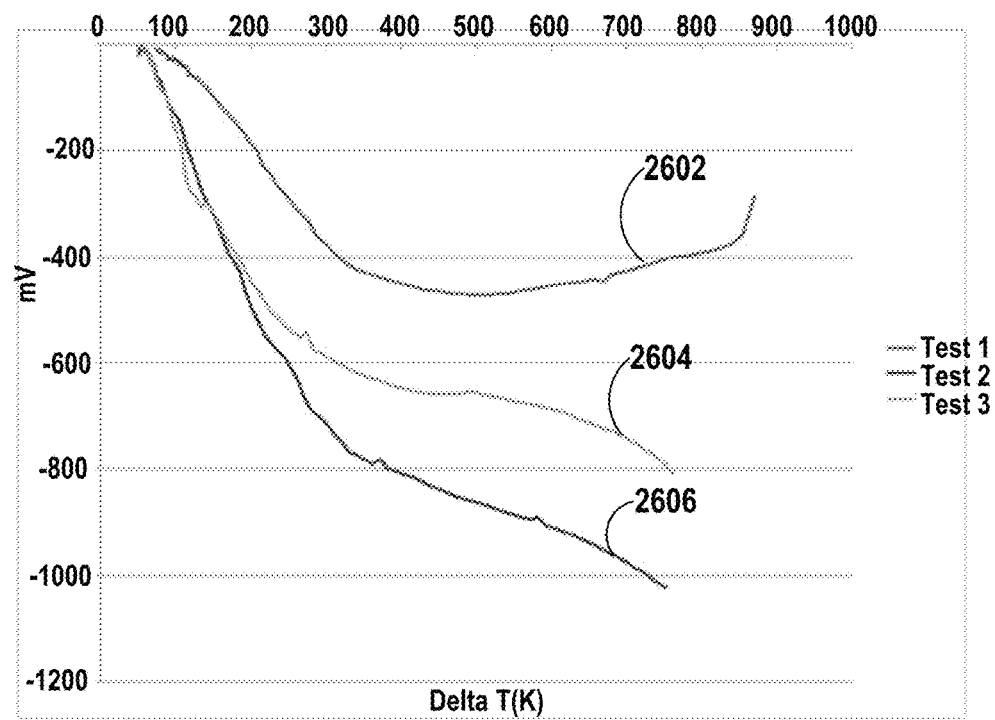
FIG. 26 is a graph including plots, for three test runs, of voltage versus temperature difference between hot and cold sides for a thermoelectric generator according to an embodiment of the invention.

FIG. 26 is a graph 2600 including plots 2602, 2604, 2606, for three test runs, of voltage versus temperature difference between hot and cold sides for a thermoelectric generator according to an embodiment of the invention. The abscissa of the graph indicates the aforementioned temperature difference in degrees Celsius or Kelvin and the ordinate indicates a corresponding thermoelectrically induced voltage in millivolts. The thermoelectric generator for which the test results are shown in FIG. 26 includes solid silicon carbide fibers doped with phosphorous. The silicon carbide fibers were surrounded yttria-stabilized zirconia aerogel.

Figure 27:
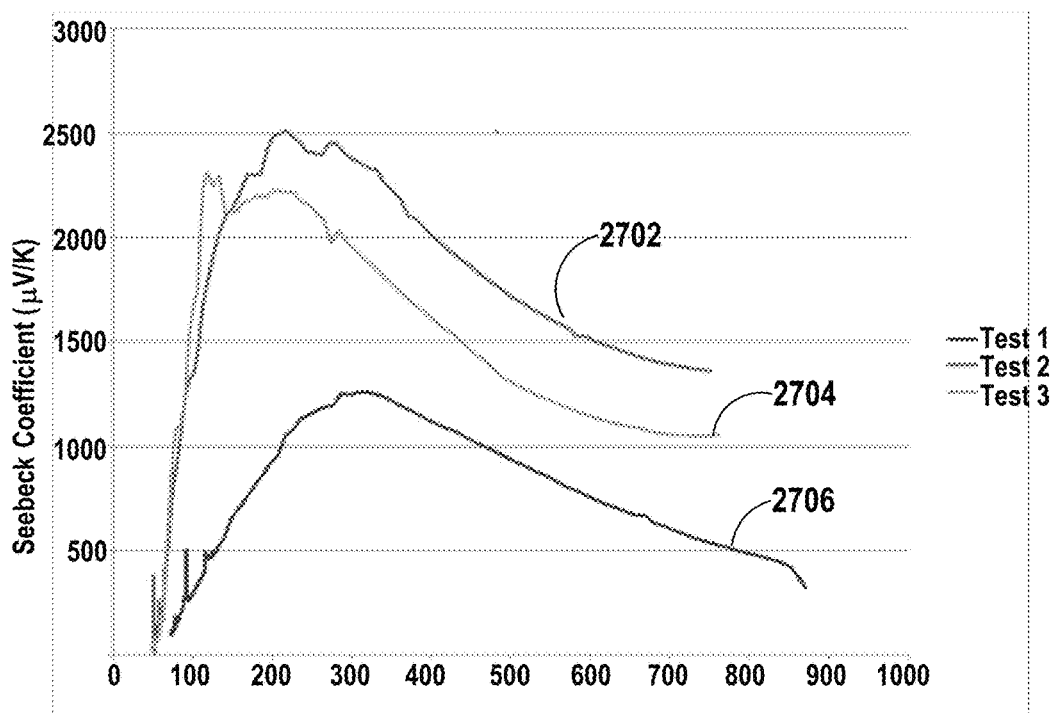
FIG. 27 is a graph including plots, for three test runs, of Seebeck coefficient versus temperature difference between hot and cold sides for the same thermoelectric generator for which data is shown in FIG. 26.

FIG. 27 is a graph 2700 including plots 2702, 2704, 2706, for three test runs, of Seebeck coefficient versus temperature difference between hot and cold sides for the same thermoelectric generator for which data is shown in FIG. 26. Certain embodiments of the present invention exhibit Seebeck coefficients of at least 500 $\mu$V/K, more preferably at least 1000 $\mu$V/K, and even more preferably at least 2000 $\mu$V/K.

Figure 28:
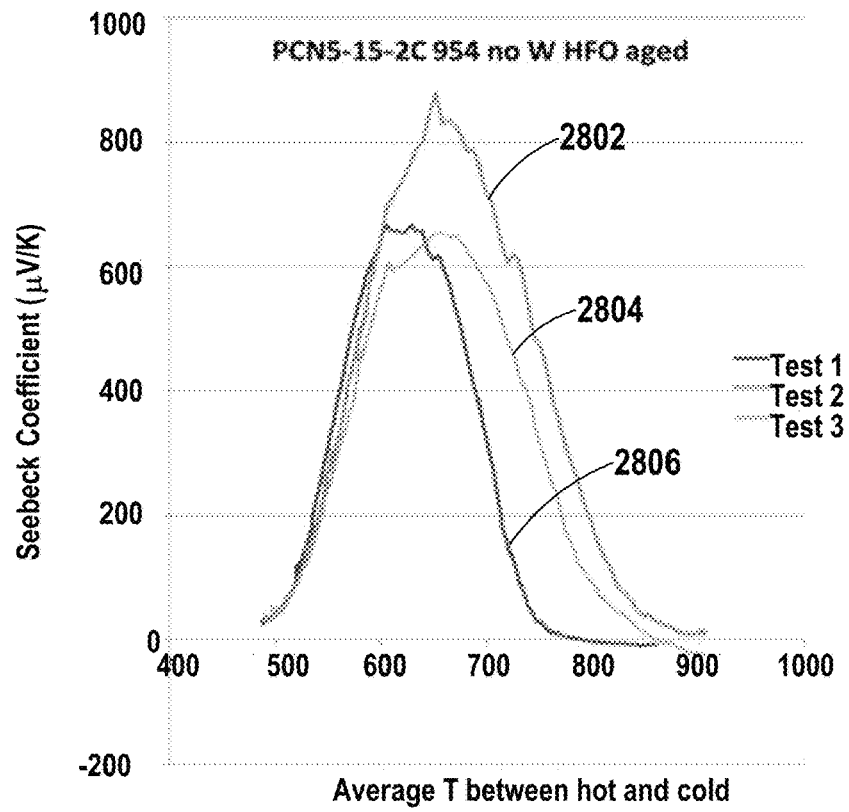
FIG. 28 is a graph including plots, for three test runs, of Seebeck coefficient versus temperature difference between hot and cold sides for another thermoelectric generator according to an embodiment of the invention.

FIG. 28 is a graph 2800 including plots 2802, 2804, 2806, for three test runs, of Seebeck coefficient versus temperature difference between hot and cold sides for another thermoelectric generator according to another embodiment of the invention. The thermoelectric data for which the data is shown in FIG. 28 included hollow boron doped SiC fibers. The fibers were prepared by electrospinning a polycarbosilane SiC precursor, curing in a nitrogen atmosphere with about 60 ppm oxygen, followed by pyrolyzing by heating in an argon ambient from room temperature to 1000 C at a temperature ramp rate of 1 degree C. per minute. Hafnia Oxide aerogel was formed in-situ around the SiC fibers thereby encapsulating the SiC nanofibers in Hafnia Oxide aerogel. The aerogel with encapsulated SiC fibers has then aged by heating in air to 500 C for 15 minutes. One method of initially forming the aerogel that may be employed in constructing thermoelectric generators disclosed herein is disclosed by A. E. Gash et al "New sol-gel synthetic route to transition and main group metal oxide aerogels using inorganic salt precursors", Journal of Non-Crystalline solids 285 (2001) 22-28. Certain embodiments of the present invention the aerogel includes an early transition metal. According to certain embodiments the aerogel includes an a group IV transition metal. According to certain embodiments the aerogel includes an element selected from the group consisting of titanium, zirconium and hafnium.

Figure 29:
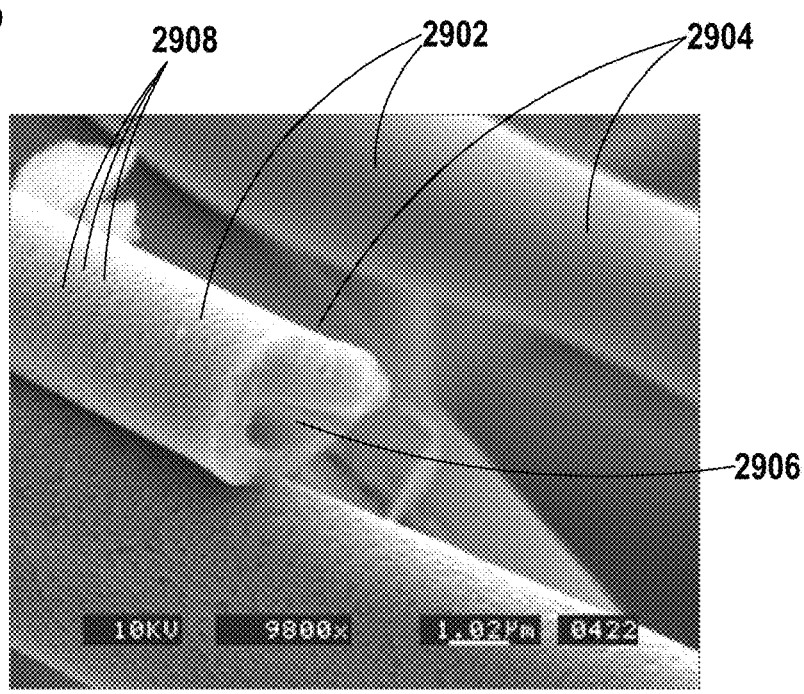
FIG. 29 is a scanning electron micrograph of a hollow porous SiC semiconductor fibers that may be used in a thermoelectric generator according to certain embodiments of the invention

FIG. 29 is a scanning electron micrograph of a hollow porous SiC semiconductor fibers 2902 that may be used in a thermoelectric generator according to certain embodiments of the invention. The fibers 2902 include a generally cylindrical wall 2904 defining a generally longitudinal hole 2906 generally centered within each fiber 2902. The generally cylindrical wall includes and a multitude of pores 2908 in the SiC generally cylindrical wall 2904. The spinneret 500 shown in FIGS. 5a, 5b and the method 1400 shown in FIG. 14 may be used to make the hollow porous SiC semiconductor fibers. In this case polyurethane was used as a fugitive core material and without wishing to be bound to any particular theory regarding the porosity it is believed that the choice of polyurethane led to the creation of the pores 2908 during the curing and/or pyrolyzing steps (discussed above in reference to FIG. 28).

Figure 30:
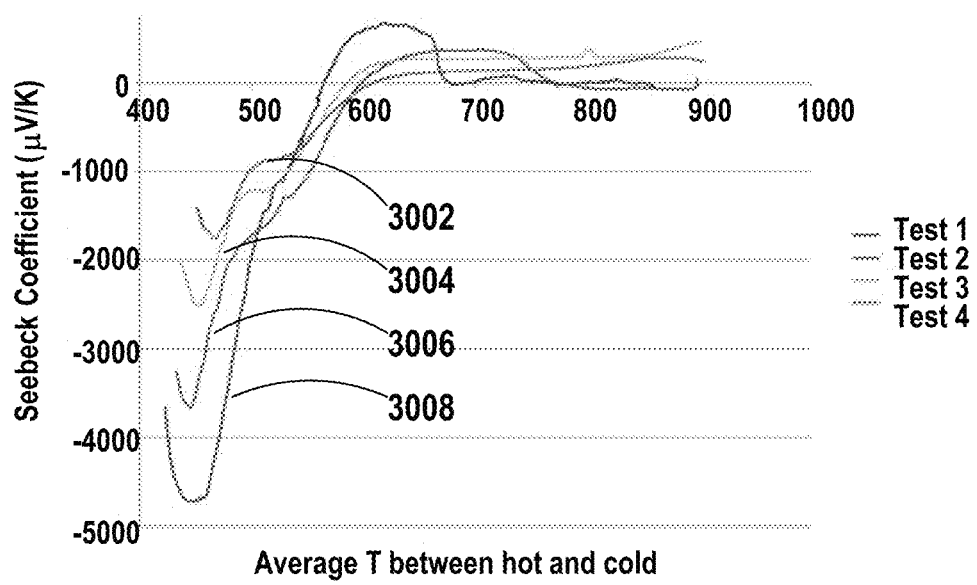
FIG. 30 is a graph including plots, for four test runs, of Seebeck coefficient versus average temperature of hot and cold sides for a thermoelectric generator including the hollow and porous SiC fibers shown in FIG. 29.

FIG. 30 is a graph 3000 including plots 3002, 3004, 3006, 3008 for four test runs, of Seebeck coefficient versus average temperature of hot and cold sides for a thermoelectric generator including the hollow and porous SiC fibers shown in FIG. 29.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A thrust propulsion engine including a first wall and a second wall and a thermoelectric generator disposed between the first wall and the second wall wherein the thermoelectric generator comprises:
   a heat source contact;
   a heat sink contact; and
   a plurality of co-axial fibers, each of said co-axial fibers comprising a core having a first doping type and a cladding having a second doping type disposed about said core, said plurality of co-axial fibers extending from said heat source contact to said heat sink contact.

2. The thrust propulsion engine according to claim 1 wherein said heat sink contact further comprises a first electrical contact and a second electrical contact, wherein said core extends beyond said cladding so as to present an exposed portion of said core, said cladding is electrically coupled to said first electrical contact and said core is electrically coupled to said second electrical contact.

3. The thrust propulsion engine according to claim 1 wherein said heat source contact includes a hole and said plurality of co-axial fibers have ends inserted in said hole.

4. The thrust propulsion engine according to claim 1 wherein said plurality of co-axial fibers have a serpentine shape that meanders back and forth between said heat source contact and said heat sink contact.

5. The thrust propulsion engine according to claim 4 wherein said heat sink contact further comprises a first electrical contact and a second electrical contact and wherein proceeding along a length of a particular co-axial fiber of said plurality co-axial fibers, said particular coaxial fiber includes: a first portion at which said cladding is electrically coupled to said first electrical contact; a second portion thermally coupled to said heat source contact; a third portion at which said core is exposed and is electrically coupled to said second electrical contact.

6. The thrust propulsion engine according to claim 1 wherein said first wall is a nozzle inner wall and said second wall is a nozzle outer wall.

7. The thrust propulsion engine according to claim 1 wherein the first wall comprises a wall of a combustion chamber and the second wall comprises a housing wall, and the thrust propulsion engine comprises a jet engine.

8. The thrust propulsion engine according to claim 1 comprising a rocket engine.

* * * * *